US008710578B2

(12) United States Patent
Jenne et al.

(10) Patent No.: US 8,710,578 B2
(45) Date of Patent: *Apr. 29, 2014

(54) SONOS STACK WITH SPLIT NITRIDE MEMORY LAYER

(75) Inventors: Fredrick Jenne, Sunnyvale, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 53 days.

This patent is subject to a terminal disclaimer.

(21) Appl. No.: 13/431,069

(22) Filed: Mar. 27, 2012

(65) Prior Publication Data

US 2013/0175600 A1 Jul. 11, 2013

Related U.S. Application Data

(63) Continuation-in-part of application No. 12/767,105, filed on Apr. 26, 2010, now Pat. No. 8,222,688.

(60) Provisional application No. 61/172,320, filed on Apr. 24, 2009.

(51) Int. Cl.
*H01L 29/792* (2006.01)

(52) U.S. Cl.
USPC .................. 257/324; 438/763; 257/E21.423

(58) Field of Classification Search
USPC ........... 257/324, 325, 321; 438/763, 786, 791
See application file for complete search history.

(56) References Cited

U.S. PATENT DOCUMENTS

| | | | |
|---|---|---|---|
| 6,153,543 A | 11/2000 | Chesire et al. | |
| 6,214,689 B1 | 4/2001 | Lim et al. | |
| 6,429,081 B1 | 8/2002 | Doong et al. | |
| 6,461,899 B1 | 10/2002 | Kitakado et al. | |
| 6,818,558 B1 | 11/2004 | Rathor et al. | |
| 6,833,582 B2 * | 12/2004 | Mine et al. | 257/326 |
| 6,946,349 B1 | 9/2005 | Lee et al. | |
| 7,060,594 B2 | 6/2006 | Wang | |
| 7,112,486 B2 | 9/2006 | Cho et al. | |
| 7,279,740 B2 | 10/2007 | Bhattacharyya et al. | |
| 7,315,474 B2 | 1/2008 | Lue | |
| 7,576,386 B2 | 8/2009 | Lue et al. | |
| 7,636,257 B2 | 12/2009 | Lue | |
| 7,646,637 B2 | 1/2010 | Liao | |
| 7,723,789 B2 | 5/2010 | Lin et al. | |
| 7,999,295 B2 | 8/2011 | Lai et al. | |

(Continued)

OTHER PUBLICATIONS

International Search Report for International Application No. PCT/US13/29784 dated May 20, 2013; 2 pages.

(Continued)

*Primary Examiner* — Reema Patel

(57) ABSTRACT

Embodiments of a non-planar memory device including a split charge-trapping region and methods of forming the same are described. Generally, the device comprises: a channel formed from a thin film of semiconducting material overlying a surface on a substrate connecting a source and a drain of the memory device; a tunnel oxide overlying the channel; a split charge-trapping region overlying the tunnel oxide, the split charge-trapping region including a bottom charge-trapping layer comprising a nitride closer to the tunnel oxide, and a top charge-trapping layer, wherein the bottom charge-trapping layer is separated from the top charge-trapping layer by a thin anti-tunneling layer comprising an oxide. Other embodiments are also disclosed.

20 Claims, 21 Drawing Sheets

(56) References Cited

U.S. PATENT DOCUMENTS

| | | |
|---|---|---|
| 8,222,688 B1 * | 7/2012 | Jenne et al. .................. 257/324 |
| 8,283,261 B2 | 10/2012 | Ramkumar |
| 8,318,608 B2 | 11/2012 | Ramkumar et al. |
| 2001/0052615 A1 | 12/2001 | Fujiwara |
| 2003/0122204 A1 | 7/2003 | Nomoto et al. |
| 2004/0173918 A1 | 9/2004 | Kamal et al. |
| 2004/0207002 A1 | 10/2004 | Ryu et al. |
| 2005/0026637 A1 | 2/2005 | Fischer et al. |
| 2005/0070126 A1 | 3/2005 | Senzaki |
| 2005/0093054 A1 | 5/2005 | Jung |
| 2005/0098839 A1 | 5/2005 | Lee et al. |
| 2005/0266637 A1 | 12/2005 | Wang |
| 2006/0081331 A1 | 4/2006 | Campian |
| 2006/0111805 A1 | 5/2006 | Yokoyama et al. |
| 2006/0113586 A1 | 6/2006 | Wang |
| 2006/0220106 A1 | 10/2006 | Choi et al. |
| 2006/0281331 A1 | 12/2006 | Wang |
| 2007/0029625 A1 | 2/2007 | Lue et al. |
| 2007/0031999 A1 | 2/2007 | Ho et al. |
| 2007/0051306 A1 | 3/2007 | Ivanov et al. |
| 2007/0066087 A1 | 3/2007 | Jung |
| 2008/0029399 A1 | 2/2008 | Tomita et al. |
| 2008/0087942 A1 * | 4/2008 | Hsu et al. ...................... 257/324 |
| 2008/0150003 A1 | 6/2008 | Chen et al. |
| 2008/0272424 A1 | 11/2008 | Kim et al. |
| 2008/0286927 A1 | 11/2008 | Kim et al. |
| 2009/0011609 A1 | 1/2009 | Ramkumar et al. |
| 2009/0039414 A1 | 2/2009 | Lue et al. |
| 2009/0179253 A1 | 7/2009 | Levy et al. |
| 2009/0227116 A1 | 9/2009 | Joo et al. |
| 2011/0248332 A1 | 10/2011 | Levy et al. |

OTHER PUBLICATIONS

Suhane et al., "Experimental Evaluation of Trapping Efficiency in Silicon Nitride Based Charge Trapping Memories", Solid State Device Research Conference, 2009, 4 pages.

USPTO Final Rejection for U.S. Appl. No. 13/551,237 dated Oct. 11, 2013; 9 pages.

USPTO Non Final Rejection for U.S. Appl. No. 12/767,105 dated Apr. 21, 2011; 7 pages.

USPTO Non Final Rejection for U.S. Appl. No. 12/767,105 dated Oct. 18, 2011; 7 pages.

USPTO Non Final Rejection for U.S. Appl. No. 13/551,237 dated Jul. 18, 2013; 6 pages.

USPTO Notice of Allowance for U.S. Appl. No. 12/767,105 dated Apr. 4, 2012; 8 pages.

USPTO Notice of Allowance for U.S. Appl. No. 12/767,105 dated May 7, 2012; 7 pages.

USPTO Requirement for Restriction for U.S. Appl. No. 13/551,237 dated Jun. 17, 2013; 5 pages.

Written Opinion of the International Searching Authority for International Application No. PCT/US13/29784 mailed May 20, 2013; 6 pages.

* cited by examiner

US 8,710,578 B2

SONOS STACK WITH SPLIT NITRIDE MEMORY LAYER

CROSS-REFERENCE TO RELATED APPLICATIONS

This application is a continuation-in-part of co-pending U.S. application Ser. No. 12/767,105, filed Apr. 26, 2010, which claims the benefit of priority under 35 U.S.C. 119(e) to U.S. Provisional Patent Application Ser. No. 61/172,320, filed on Apr. 24, 2009, both of which are incorporated by reference herein.

TECHNICAL FIELD

Embodiments of the present invention relate to the field of semiconductor devices.

BACKGROUND

Non-volatile semiconductor memories, such as a split gate flash memory, sometimes use a stacked floating gate structure, in which electrons are induced into a floating gate of a memory cell to be programmed by biasing a control gate and grounding a body region of a substrate on which the memory cell is formed.

An oxide-nitride-oxide (ONO) stack may be used as either a charge storing layer, as in silicon-oxide-nitride-oxide-silicon (SONOS) transistor, or as an isolation layer between the floating gate and control gate, as in a split gate flash memory.

FIG. 1 is a partial cross-sectional view of a structure for a semiconductor device 100 having a SONOS gate stack or structure 102. The structure 100 includes a conventional ONO stack 104 formed over a surface 106 of a silicon substrate 108. The device 100 typically further includes one or more diffusion regions 110, such as source and drain regions, aligned to the gate stack and separated by a channel region 112. The SONOS structure 102 includes a polysilicon gate layer 114 formed upon and in contact with the ONO stack 104. The poly gate 114 is separated or electrically isolated from the substrate 108 by the ONO stack 104. The ONO stack 104 generally includes a lower (tunnel) oxide layer 116, a nitride or oxynitride layer 118 which serves as a charge storing or memory layer for the device 100, and a top oxide layer 120 overlying the nitride or oxynitride layer 118.

One problem with this conventional SONOS structure 102 is the poor data retention of the nitride or oxynitride layer 118 that limits the device 100 lifetime and/or its use in several applications due to leakage current through the layer. Another problem with conventional SONOS structures 102 is that the stoichiometry of the layer 118 is non-uniform across the thickness of the layer. In particular, the layer 118 is conventionally formed or deposited in a single step using a single process gas mixture and fixed or constant processing conditions in an attempt to provide a homogeneous layer having a high nitrogen and high oxygen concentration across the thickness of the relatively thick layer. However, this may result in nitrogen, oxygen and silicon concentrations that vary throughout the conventional layer 118. Consequently, the charge storage characteristics, and in particular programming and erase speed and data retention of a memory device 100 made with the ONO stack 104, are adversely effected.

FIG. 2-5 illustrate charge retention and migration in a conventional SONOS structure such as the one illustrated in FIG. 1. Charge traps are distributed through the nitride layer 118. The distribution of traps is uniform under ideal stoichiometric conditions (FIG. 2), but typically the distribution would not be so ideally uniform. When an ERASE (FIG. 3) is performed, holes migrate toward the blocking oxide 120. Electron charge accumulates at the layer boundaries after programming (FIG. 4). This stored charge distribution can lead to significant leakage due to tunneling at the nitride boundaries, for example by the process illustrated in the energy diagram FIG. 5, in which stored charge transitions among trapped states (e.g. $E_{TA}$, $E_{TD}$) to cause leakage.

Thus there is an ongoing need for a memory device that exhibits improved data retention and improved stoichiometry.

BRIEF DESCRIPTION OF THE DRAWINGS

These and various other features and advantages of the present structure and method will be apparent upon reading of the following detailed description in conjunction with the accompanying drawings and the appended claims provided below, where:

DETAILED DESCRIPTION

Figure 1:
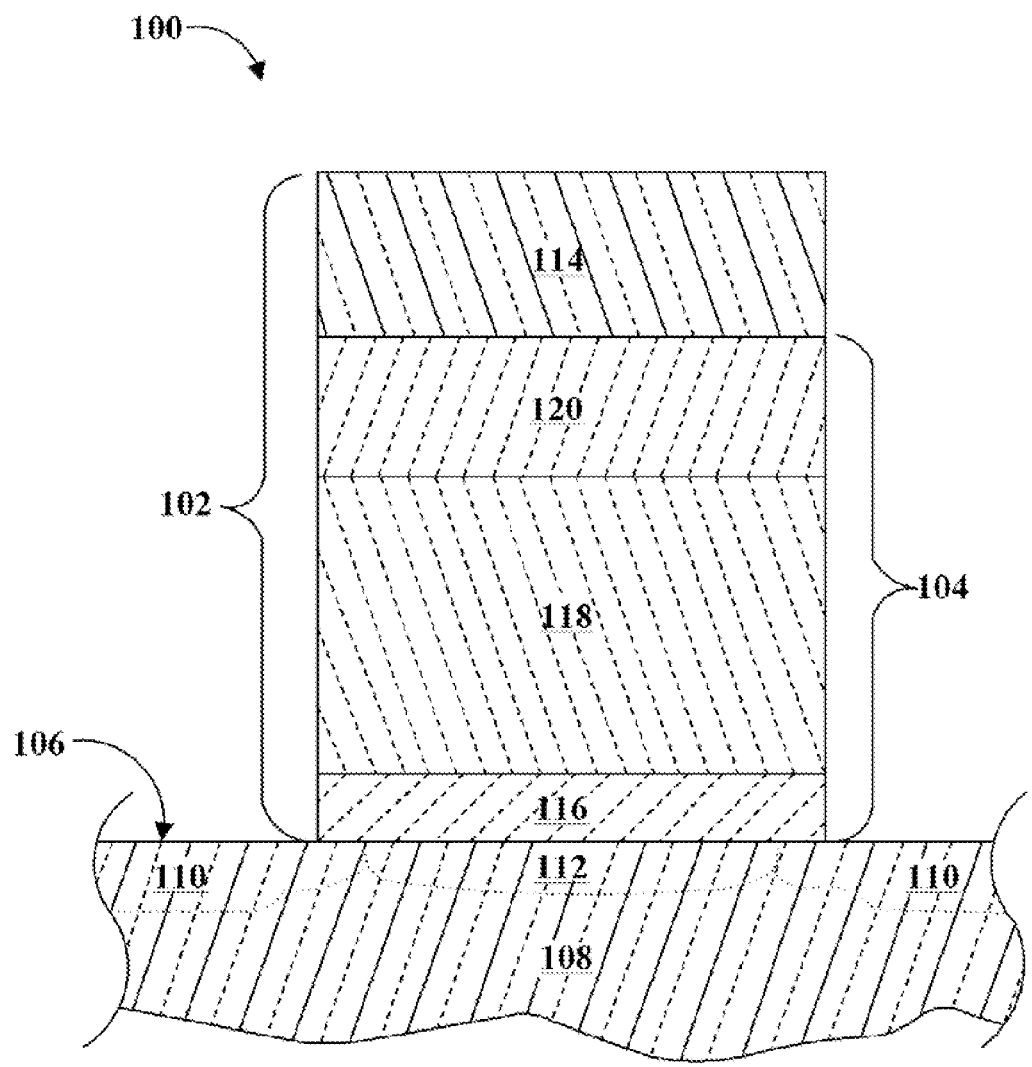
FIG. 1 is a cross-sectional view of a conventional SONOS structure.
Figure 2:
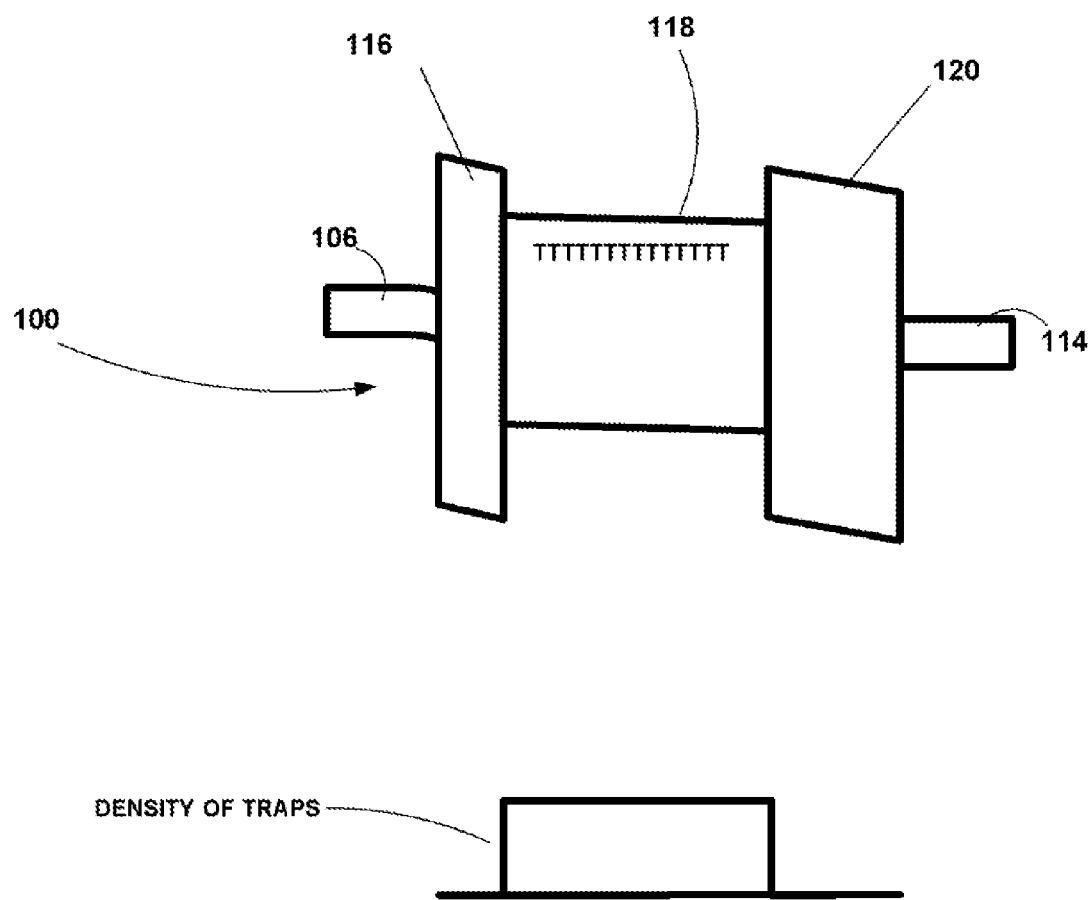
FIGS. 2-4 illustrate charge retention and migration in a conventional SONOS structure such as the one illustrated in FIG. 1.
Figure 3:
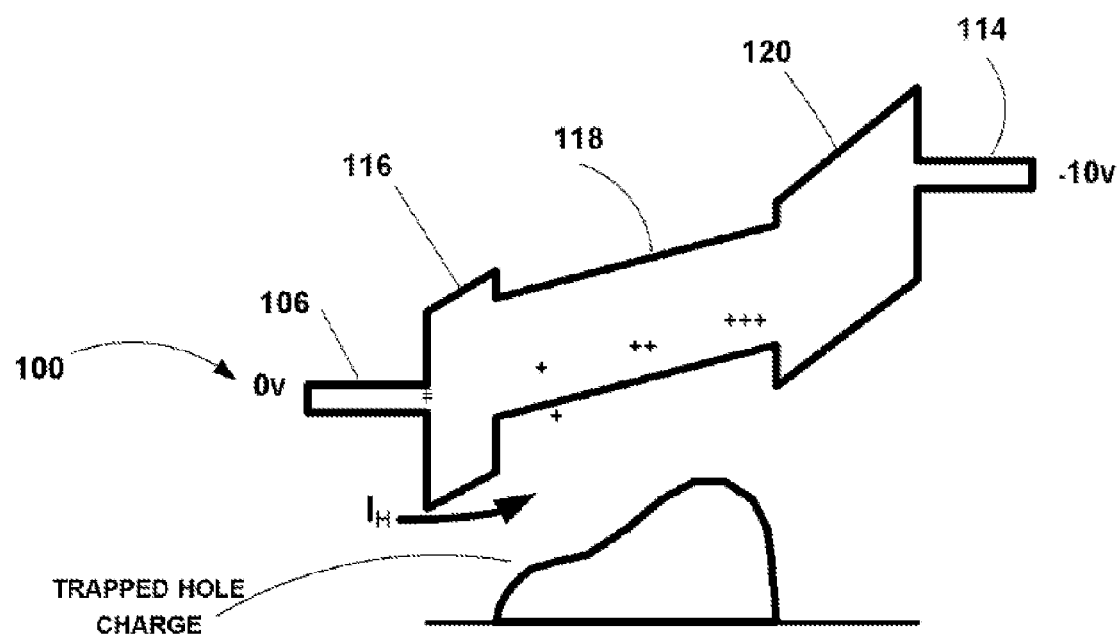
Figure 4:
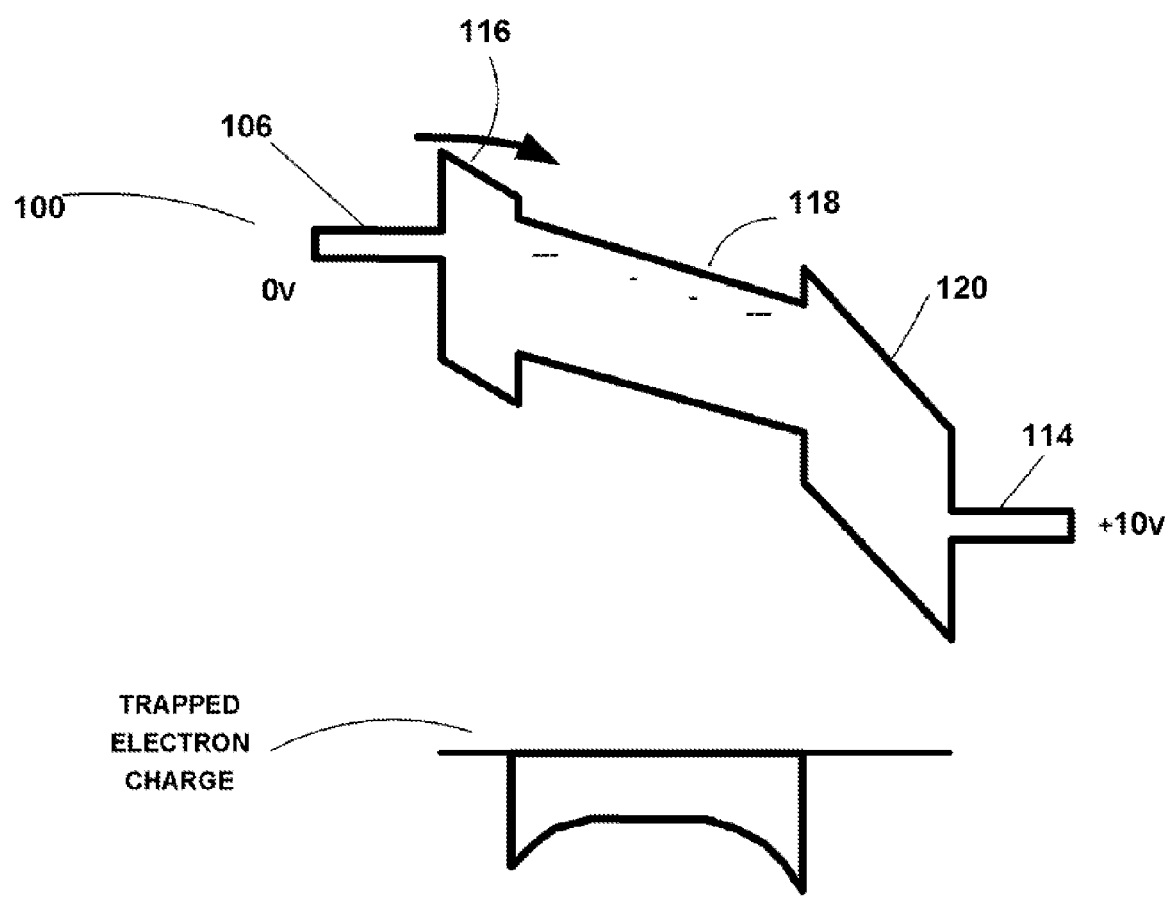
Figure 5:
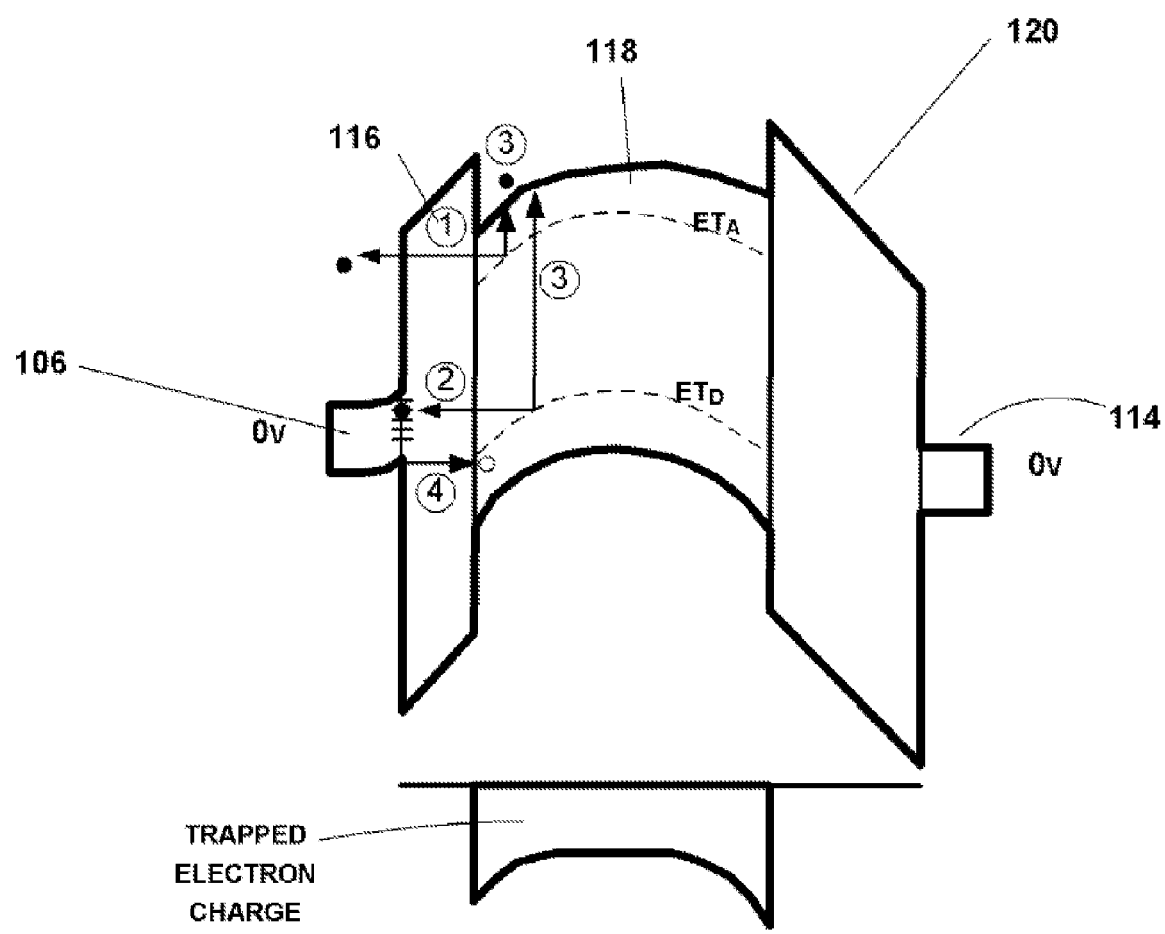
FIG. 5 illustrates an energy band diagram for a conventional SONOS structure, in which stored charge transitions among trapped states (e.g. $E_{TA}$, $E_{TD}$) to cause leakage.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

Overview

A charge-storage circuit may be formed with multiple charge storing layers including multiple nitride layers having differing concentrations of oxygen, nitrogen and/or silicon. The nitride layers may include at least a top nitride layer and a bottom nitride layer. At least the bottom nitride layer may comprise silicon oxynitride (e.g. $Si_xO_yN_x$). The stoichiometric compositions of the layers may be tailored or selected such that the lower or bottom nitride has a high oxygen and silicon content, and the top nitride layer has high silicon and a high nitrogen concentration with a low oxygen concentration to produce a silicon-rich nitride or oxynitride. The silicon-rich and oxygen-rich bottom nitride layer reduces stored charge loss without compromising device speed or an initial (beginning of life) difference between program and erase voltages. The silicon-rich, oxygen-lean top nitride layer increases a difference between programming and erase voltages when the structure is employed in memory devices, thereby improving device speed, increasing data retention, and extending the operating life of the device.

However, this structure also has drawbacks in terms of charge retention. Therefore, a middle oxide layer may be formed between the two nitride layers, forming a split charge trapping region comprising two nitride layers separated by a relatively thin oxide layer. In one embodiment, the two nitride layers are approximately equal thicknesses. Each nitride layer may be at least 30 Å. The middle oxide layer may be at least 5 Å. Some tolerance for process variations is also envisioned, for example ±2 Å. In general, the middle oxide layer will be thin relative to the two nitride layers, where 'thin relative to' means at least a ratio of about 0.75:1. One nitride layer (the bottom layer) may be closer to a substrate, and oxygen-rich relative to the other (upper) nitride layer.

One process for manufacturing such a semiconductor device includes forming a first oxide layer on a silicon substrate; forming a first nitride layer on the first oxide layer; applying radical oxidation to the first nitride layer to form a second oxide layer; and forming a second nitride layer on the second oxide layer. The first nitride layer is made oxygen-rich relative to the second nitride layer by varying the process parameters. For example, each nitride layer may be formed using a low pressure CVD process using a silicon source, a nitrogen source, and an oxygen-containing gas. With appropriate process parameters, a bottom oxynitride layer may be formed that is a silicon-rich and oxygen-rich, and a top nitride layer is may be formed that is silicon-rich, nitrogen-rich, and oxygen-lean. In one embodiment the first (lower) nitride layer is formed to a thickness of between 35 Å and 50 Å, oxidized to a depth of between 5 Å and 20 Å to form the middle oxide layer, and then the second nitride layer is formed over the middle oxide layer to a thickness of between 30 Å and 60 Å. The first (tunnel) oxide layer on the silicon substrate may be formed to a thickness of about 15-20 Å. Again, some tolerance for process variations are envisioned, for example ±2 Å.

A third oxide layer may be formed over the second nitride layer, to a thickness of about 40-50 Å, and a polysilicon or metal gate layer may be formed over the third oxide layer.

Multi-Layer Charge Storing Structure

Figure 6:
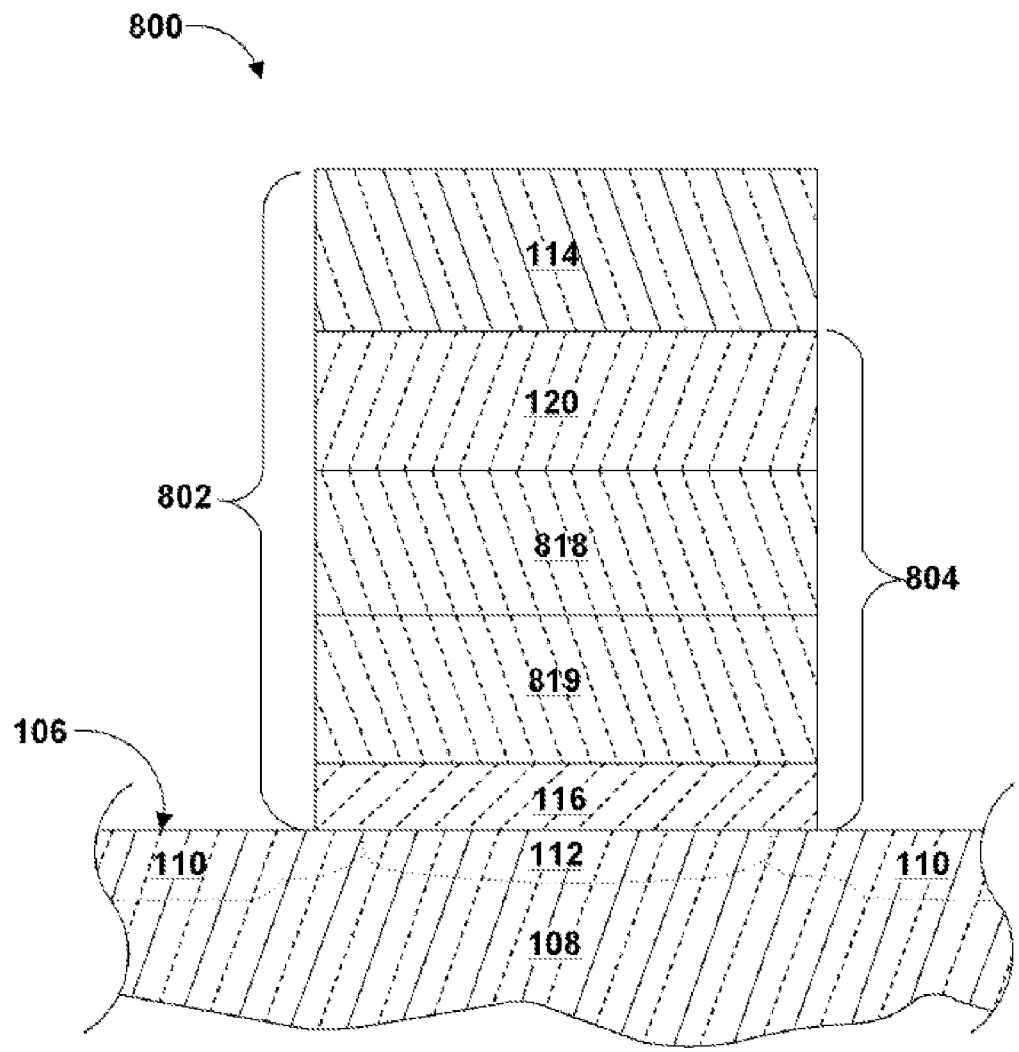
FIG. 6 is a cross-sectional view of a SONNOS structure.

FIG. 6 is a block diagram illustrating a cross-sectional side view of a portion of a semiconductor memory device 800. The memory device 800 includes a SONNOS gate stack 802 including an ONNO structure 804 formed over a surface 106 of silicon layer on a substrate 108. The device 800 further includes one or more diffusion regions 110, such as source and drain regions, aligned to the gate stack 802 and separated by a channel region 112. Generally, the SONNOS structure 802 includes a gate layer 114 formed upon and in contact with the ONNO structure 804. The gate 114 is isolated from the substrate 108 by the ONNO structure 804. The ONNO structure 804 includes a thin, lower oxide layer or tunneling oxide layer 116 that isolates the gate stack 802 from the channel region 112, a top or blocking oxide layer 120, and a multi-layer charge storing layer 804 including multiple nitride containing layers. Preferably, the multi-layer charge storing layer 804 includes at least two nitride layers, including a top nitride layer 818 and a bottom nitride layer 819.

Figure 7:
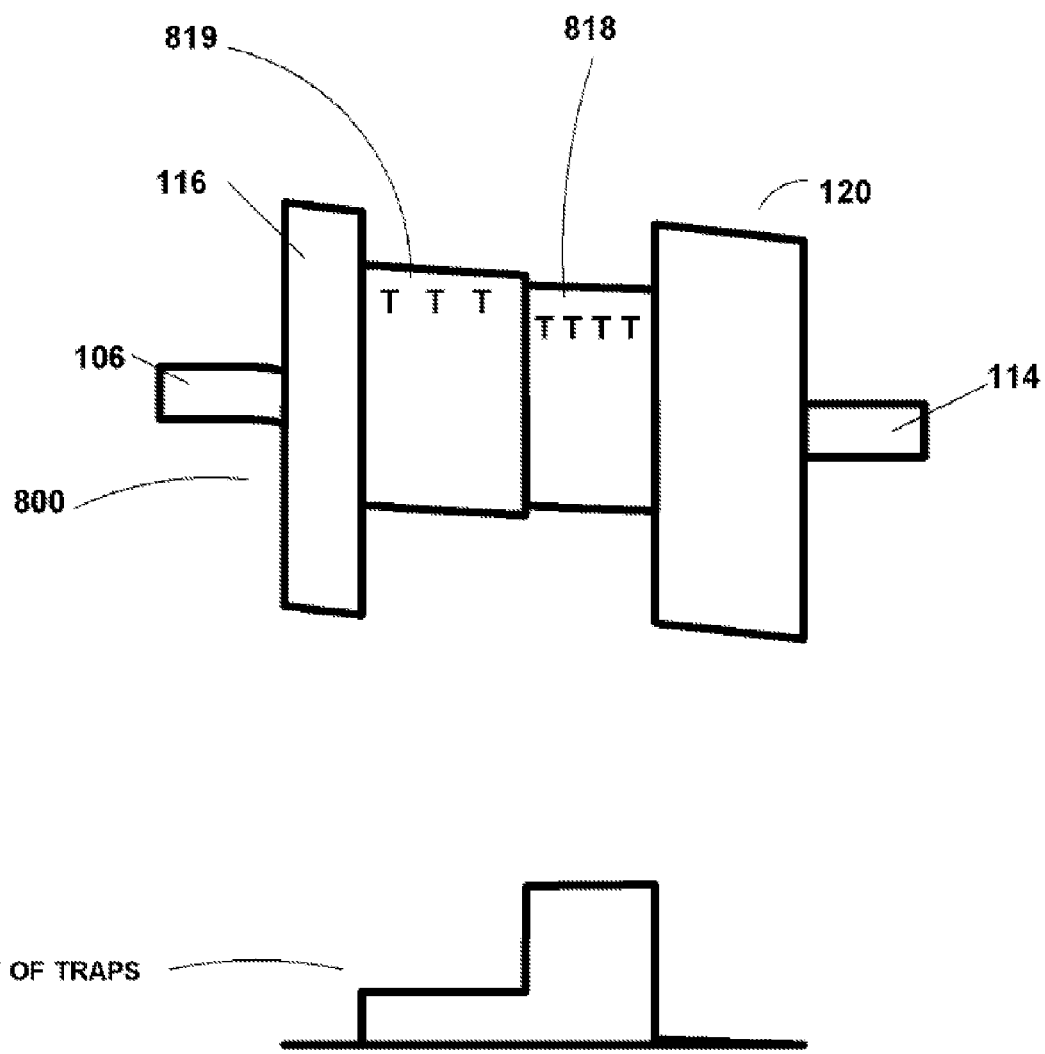
FIG. 7-9 illustrate charge retention and migration in a SONNOS structure such as the one illustrated in FIG. 6.
Figure 8:
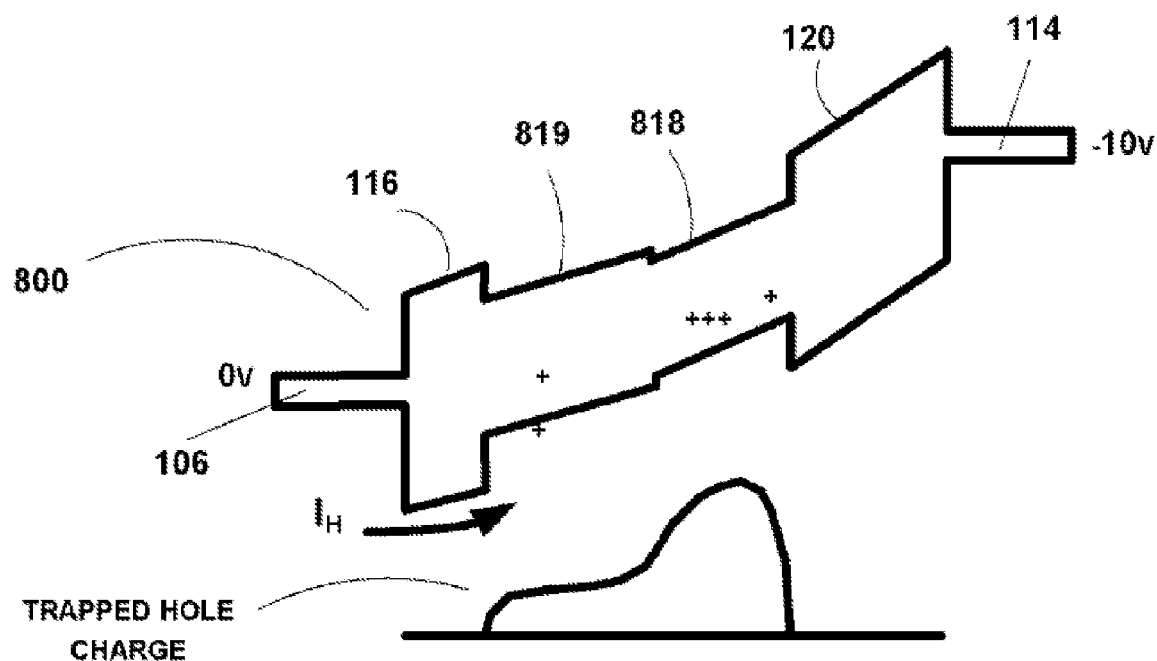
Figure 9:
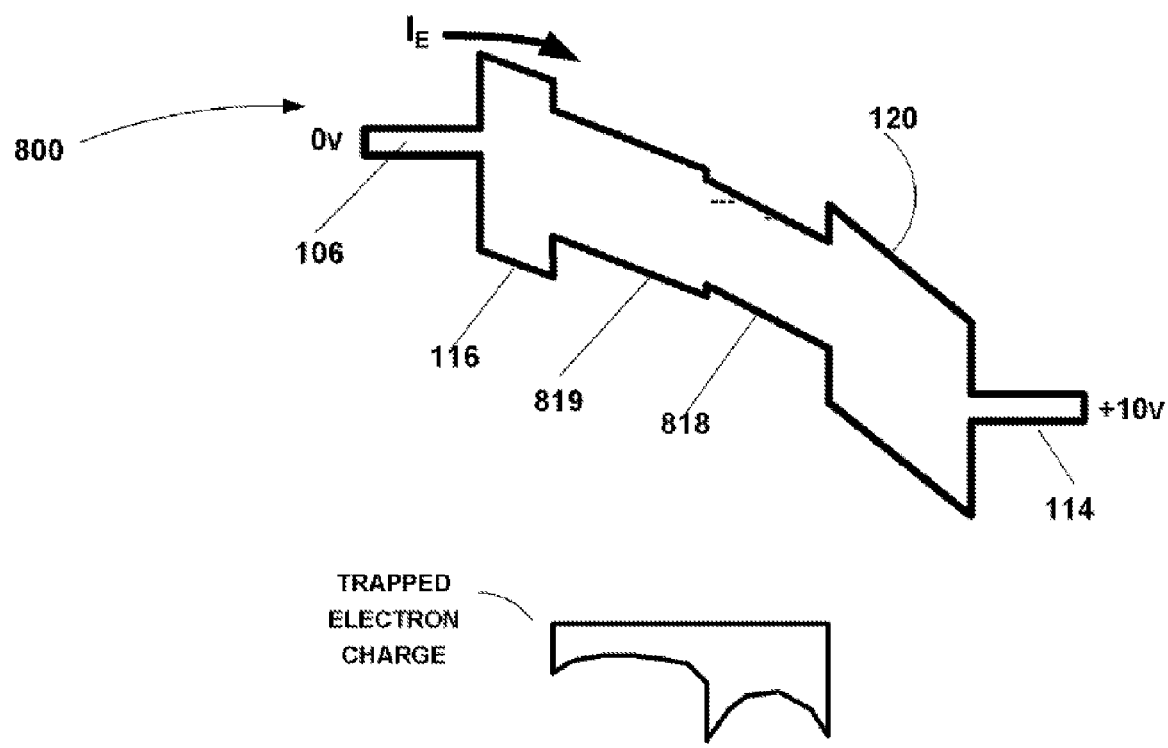
Figure 10:
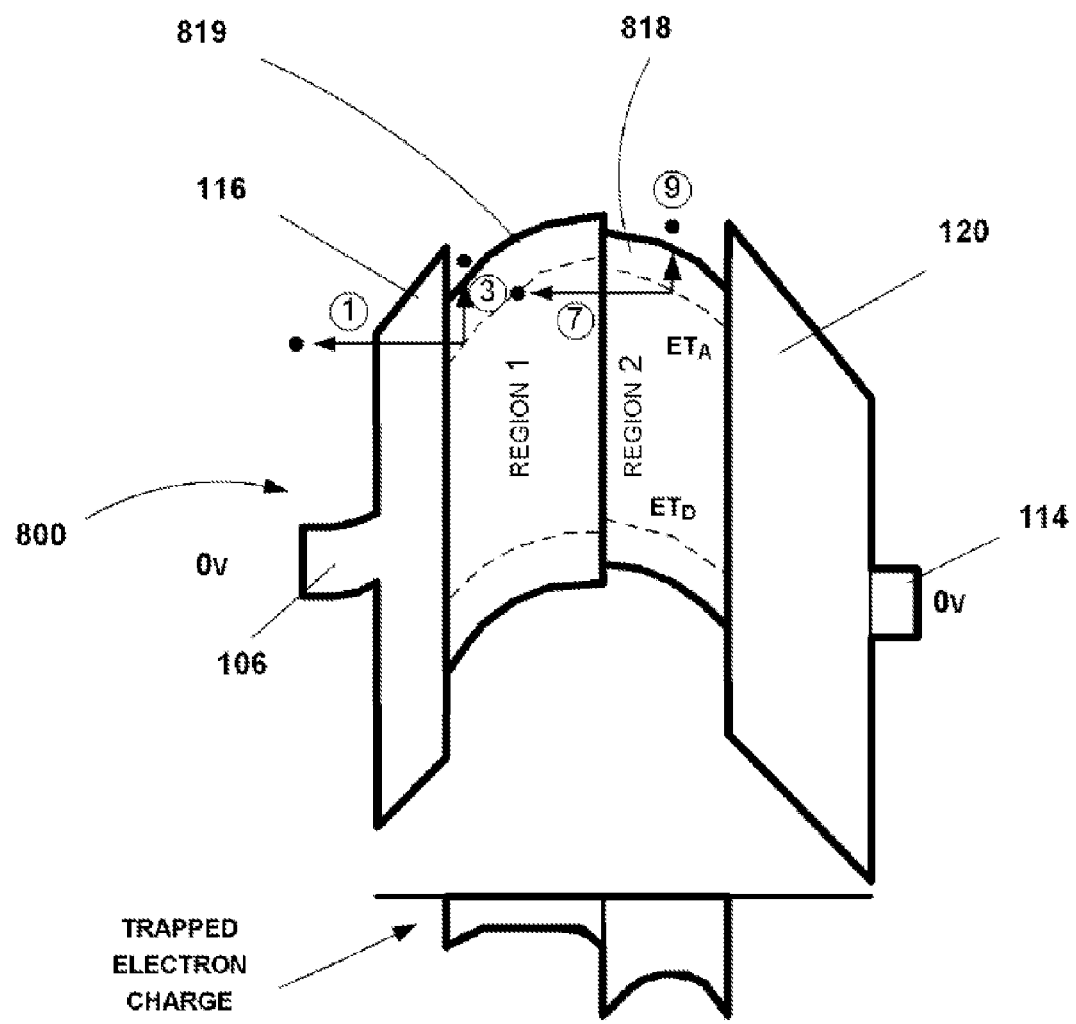
FIG. 10 illustrates an energy band diagram for a SONNOS structure in which stored charge transitions among trapped states (e.g. $E_{TA}$, $E_{TD}$) to cause leakage.

FIG. 7-9 illustrate charge retention and migration in a SONNOS structure such as the one illustrated in FIG. 6. Charge traps are distributed through the nitride layers 818, 819, with a distribution that is uniform under ideal stoichiometric conditions (FIG. 7). As a result of an ERASE (FIG. 8), holes migrate toward the blocking oxide 120. Electron charge accumulates at the boundaries of the upper nitride layer 818 after programming (FIG. 9), and there is less accumulation of charge at the lower boundary of the lower nitride layer 819. This may result in lower leakage current. Nonetheless, this charge distribution may lead to charge leakage due to tunneling at the nitride boundaries, as shown for example in FIG. 10, which illustrates how charge may transition among different trapped states (e.g. $E_{T4}$, $E_{TD}$) to cause leakage after programming.

Oxide Split Multi-Layer Charge Storing Structure

Figure 11:
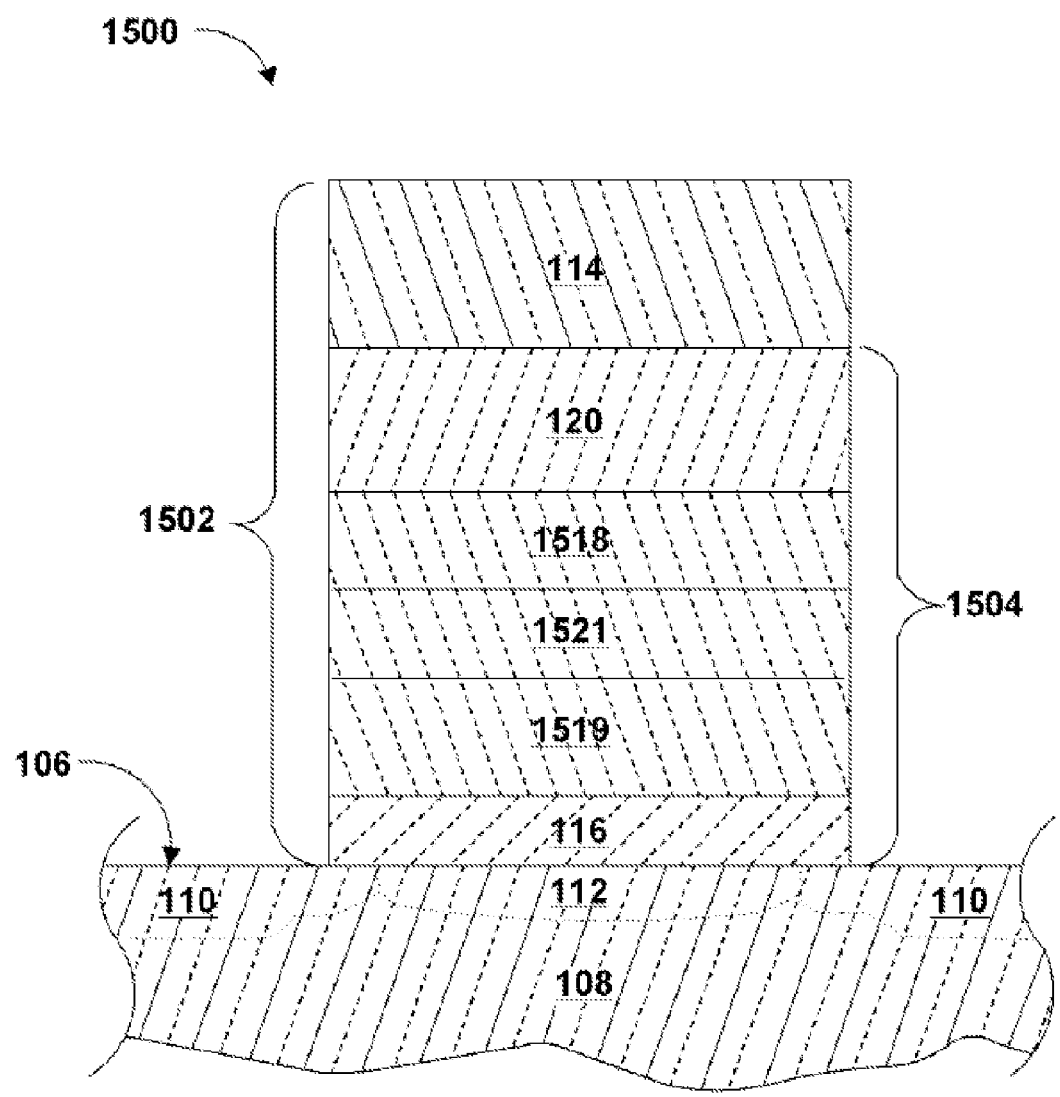
FIG. 11 is a cross-sectional view of a SONONOS structure.

FIG. 11 is a block diagram illustrating a cross-sectional side view of a semiconductor memory device 1500. The memory device 1500 includes a SONONOS stack 1502 including an ONONO structure 1504 formed over a surface 106 of a substrate 108. Substrate 108 includes one or more diffusion regions 110, such as source and drain regions, aligned to the gate stack 1502 and separated by a channel region 112. Generally, the SONONOS structure 1502 includes a polysilicon or metal gate layer 114 formed upon and in contact with the ONONO structure 1504. The gate 114 is separated or electrically isolated from the substrate 108 by the ONONO structure 1504. The ONONO structure 1504 includes a thin, lower oxide layer or tunneling oxide layer 116 that separates or electrically isolates the stack 1502 from the channel region 112, a top or blocking oxide layer 120, and a multi-layer charge storing layer 1504 including multiple nitride containing layers 1518, 1519. Preferably, the multi-layer charge storing layer 1504 includes at least two nitride layers, including a top nitride layer 1518, a bottom oxynitride layer 1519, and an intermediate oxide layer 1521.

The various layers of the device 1500 may be fabricated to certain thicknesses. Different possibilities for the thicknesses are described herein, representing possible different embodiments. In general, the middle oxide layer will be relatively thin in comparison to the two nitride layers. For example, the middle oxide may be between approximately 5 Å and 20 Å. The nitride layers may be the same or different thicknesses as one another, but will typically be at least approximately 30 Å. With advances in process technology and material science, nitride thicknesses as low as 20 Å may be possible in the near future.

Figure 12:
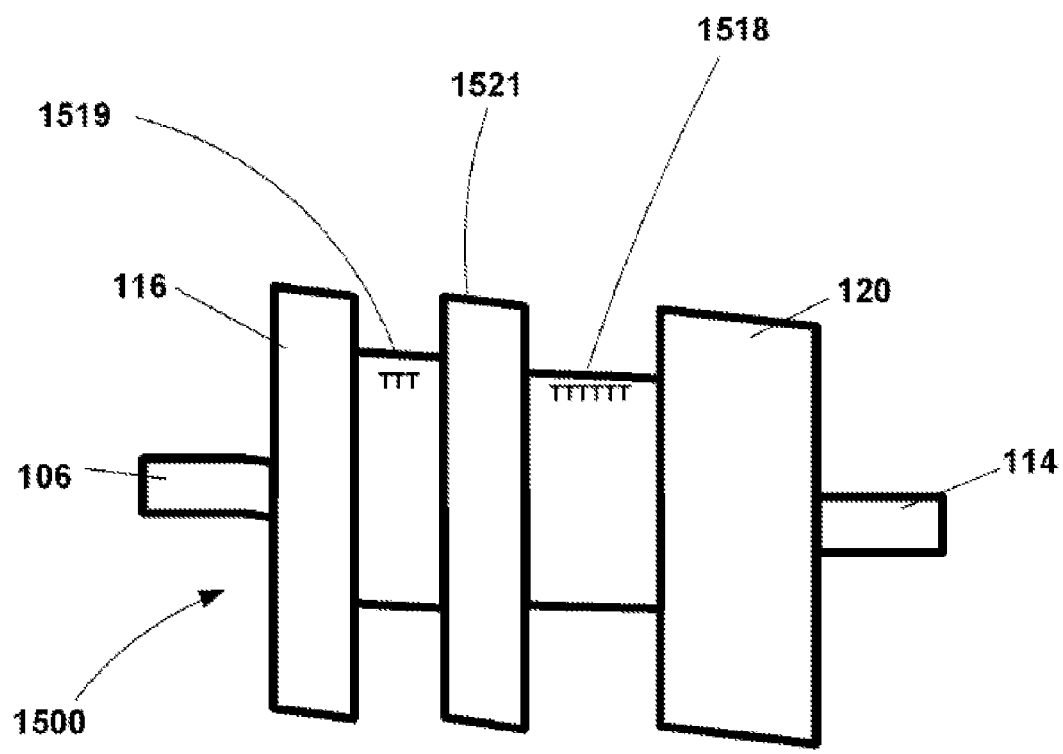
FIG. 12-14 illustrate charge retention and migration in a SONONOS structure such as the one illustrated in FIG. 14.
Figure 13:
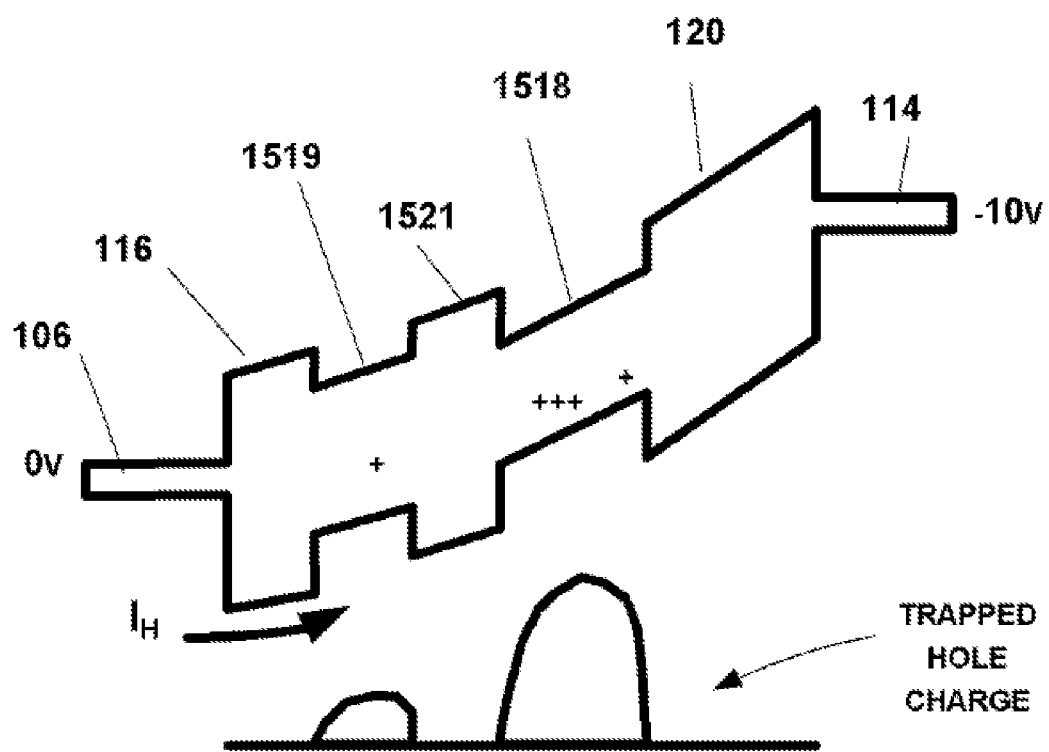
Figure 14:
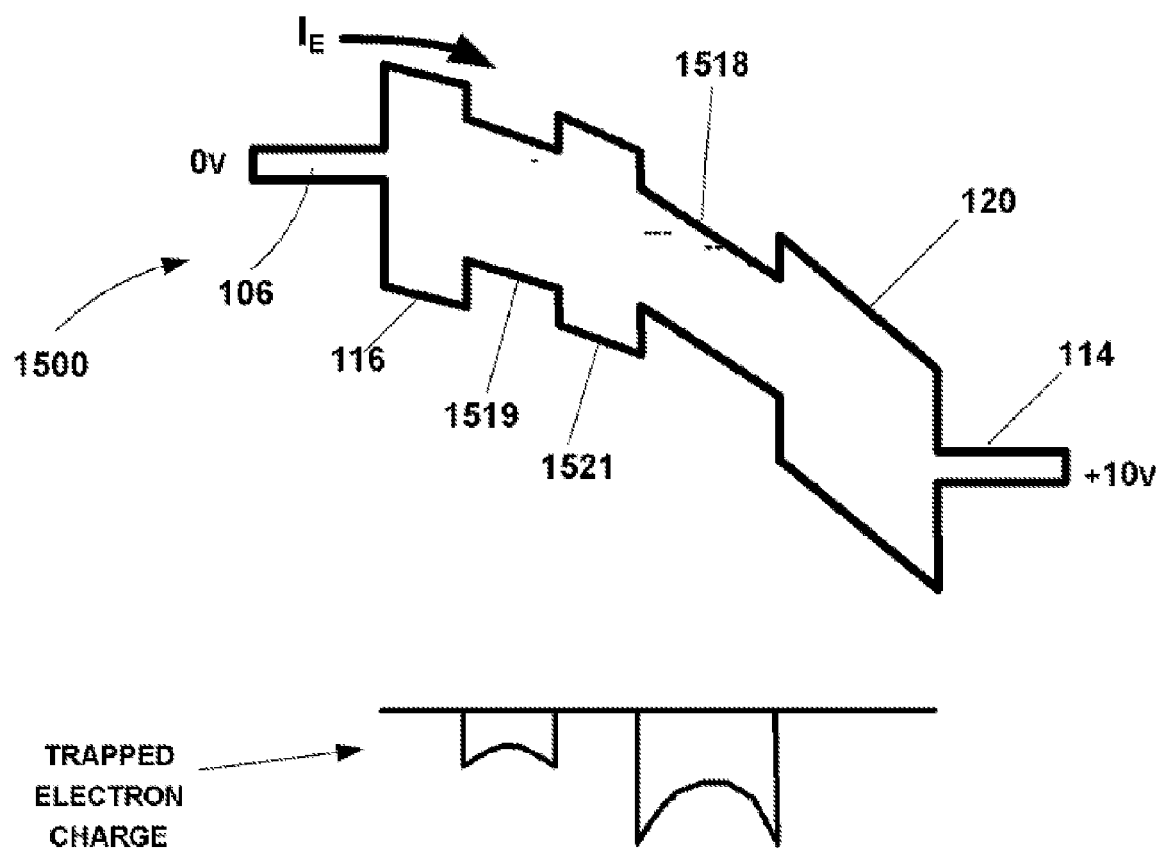

FIG. 12-14 illustrate charge retention and migration in a SONONOS structure such as the one illustrated in FIG. 11. Charge traps are distributed in the two nitride layers 1518, 1519, with a discontinuity where the intermediate oxide layer 1521 resides (few or no traps form in the oxide layer 1521).

Figure 15:
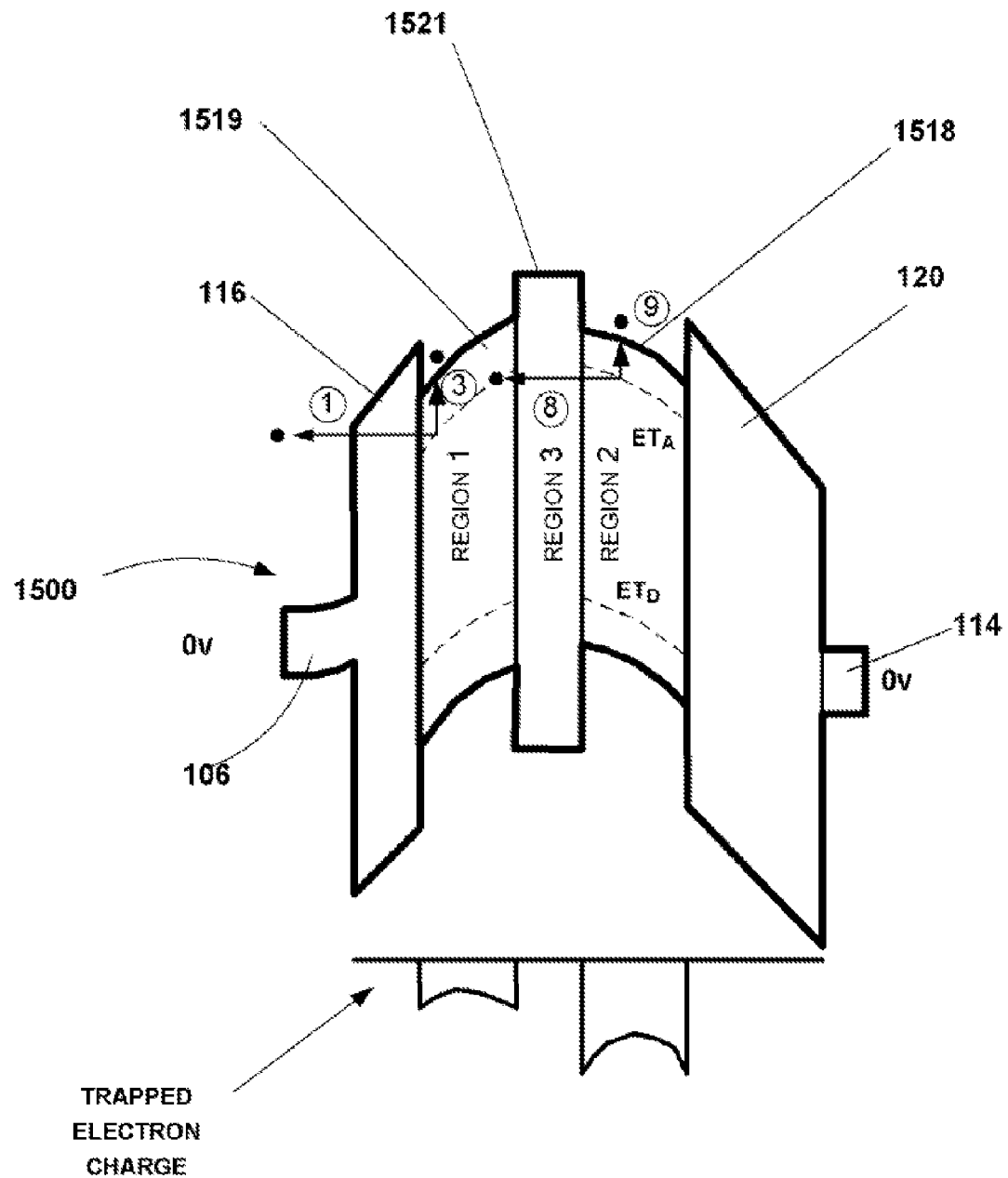
FIG. 15 illustrates an energy band diagram for a SONONOS structure in which stored charge transitions among trapped states (e.g. $E_{TA}$, $E_{TD}$) to cause leakage.

The majority of traps form in the top nitride layer 1518. Within each nitride layer, trap distribution is more or less uniform under ideal stoichiometric conditions (FIG. 12). As a result of an ERASE (FIG. 13), holes migrate toward the blocking oxide 120, but the majority of trapped hole charges form in the top nitride layer 1518. Electron charge accumulates at the boundaries of the upper nitride layer 1518 after programming (FIG. 14), and there is less accumulation of charge at the lower boundary of the lower nitride layer 1519. Furthermore, due to the intermediate oxide 1521, the probability of tunneling by trapped electron charges in the upper nitride layer 1518 is substantially reduced. This may result in lower leakage current than for the structures illustrated in FIG. 1 and FIG. 6. This charge distribution significantly lowers the probability of tunneling from the upper nitride layer, as shown for example in the energy band diagrams FIG. 15, which illustrate the obstacles to tunneling that charges encounter as they transition among different trapped states (e.g. $E_{T4}$, $E_{TD}$) after programming.

Fabrication Techniques

A process of forming a SONOS structure with superior charge retention begins with forming a first oxide layer, such as a tunneling oxide layer, of the ONO structure over a substrate. The substrate may be, for example, polysilicon, or a silicon surfaced germanium substrate. Next, the first nitride layer of a multi-layer charge storing structure is formed on the first oxide layer. This first or bottom nitride layer may be formed, for example, by a CVD process including $N_2O/NH_3$ and $DCS/NH_3$ gas mixtures in ratios and at flow rates tailored to provide a silicon-rich and oxygen-rich oxynitride layer. The first nitride layer is then oxidized to a chosen depth using radical oxidation. This forms the middle oxide layer. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

The second nitride layer of the multi-layer charge storing structure is then formed on the middle oxide layer. The second nitride layer has a stoichiometric composition of oxygen, nitrogen and/or silicon different from that of the first (lower) nitride layer. The second nitride layer may be formed or deposited by a CVD process using a process gas including $DCS/NH_3$ and $N_2O/NH_3$ gas mixtures in ratios and at flow rates tailored to provide a silicon-rich, oxygen-lean top nitride layer. Finally, a second oxide layer of the ONO structure is formed on a surface of the second nitrided layer. This top or blocking oxide layer may be formed or deposited by any suitable means. In one embodiment the top oxide is a high temperature oxide deposited in a HTO CVD process. Alternatively, the top or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

In some embodiments, it may be possible perform fabrication by forming the tunnel oxide layer in one chamber of a CVD tool, then form the bottom oxynitride layer in a second chamber of the CVD tool, then radical oxidize the lower oxynitride layer in the first chamber, then deposit more nitride in the second chamber, then radical oxidize the second nitride layer in the first chamber again, thus forming the semiconductor device using a two-chamber process.

Fabrication may further involve forming or depositing a silicon containing layer on a surface of the second oxide layer to complete a SONOS stack. The silicon containing layer may, for example, be a polysilicon layer deposited by a CVD process to form a control gate of a SONOS transistor or device. In some embodiments metal may be deposited instead of polysilicon.

Generally, the substrate 108 may include any known silicon-based semiconductor material including silicon, silicon-germanium, silicon-on-insulator, or silicon-on-sapphire substrate. Alternatively, the substrate 108 may include a silicon layer formed on a non-silicon-based semiconductor material, such as gallium-arsenide, germanium, gallium-nitride, or aluminum phosphide. Preferably, the substrate 108 is a doped or undoped silicon substrate.

The lower oxide layer or tunneling oxide layer 116 generally includes a relatively thin layer of silicon dioxide ($SiO_2$) of from about 15 Å to about 22 Å, and more preferably about 18-20 Å, with some process variation (e.g. ±1 Å). The tunneling oxide layer 116 may be formed or deposited by any suitable means including, for example, being thermally grown or deposited using chemical vapor deposition (CVD). In one embodiment, the tunnel oxide layer is formed or grown using a steam anneal. This involves a wet-oxidizing process in which the substrate 108 is placed in a in a deposition or processing chamber, heated to a temperature from about 700° C. to about 850° C., and exposed to a wet vapor for a predetermined period of time selected based on a desired thickness of the finished tunneling oxide layer 116. Exemplary process times are from about 5 to about 20 minutes. The oxidation may be performed at atmospheric or at low pressure, or using a dry process under ambient conditions using either batch or single wafer tools.

The multi-layer charge storing structure generally includes at least two nitride layers having differing compositions of silicon, oxygen and nitrogen, and a middle oxide layer between the two nitride layers. In a preferred embodiment the nitride layers are formed or deposited in a low pressure CVD process using a silicon source, such as silane ($SiH_4$), chlorosilane ($SiH_3Cl$), dichlorosilane ($SiH_2Cl_2$), tetrachlorosilane ($SiCl_4$) or Bis-TertiaryButylAmino Silane (BTBAS), a nitrogen source, such as nitrogen (N2), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing the endurance of the devices.

For example, the lower or bottom oxynitride layer 819, 1519 may be deposited over the tunneling oxide layer 116 by placing the substrate 108 in a deposition chamber and introducing a process gas including $N_2O$, NH3 and DCS, while maintaining the chamber at a pressure of from about 5 millitorr (mT) to about 500 mT, and maintaining the substrate at a temperature of from about 700° C. to about 850° C., and more preferably at least about 780° C., for a period of from about 2.5 minutes to about 20 minutes. The process gas may include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and may be introduced at a flow rate of from about 5 to about 200 standard cubic centimeters per minute (sccm). A layer produced or deposited under these condition yields a silicon-rich, oxygen-rich, bottom oxynitride layer 819, that decrease the charge loss rate after programming and after erase, which may be manifested in a small voltage shift in the retention mode.

The top nitride layer 818, 1518 may be deposited in a CVD process using a process gas including $N_2O$, NH3 and DCS, at a chamber pressure of from about 5 mT to about 500 mT, and at a substrate temperature of from about 700° C. to about 850° C., and more preferably at least about 780° C., for a period of from about 2.5 minutes to about 20 minutes. The process gas may include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and may be introduced at a flow rate of from about 5 to about 20 sccm. A layer produced or deposited under these condition yields a silicon-rich, nitrogen-rich, and oxygen-lean top nitride layer 818, 1518.

Preferably, the top nitride layer 818, 1518 is deposited sequentially, after formation of the middle oxide layer, in the same process chamber used to form the bottom oxynitride layer 819, 1519, without altering the temperature to which the substrate 108 was heated during deposition of the bottom oxynitride layer 819, 1519. In one embodiment, the top nitride layer 818, 1518 is deposited sequentially following the deposition of the bottom oxynitride layer 819, 1519 by (1) moving to a different process chamber to form the middle oxide layer by radical oxidation of the bottom oxynitride layer, (2) returning to the process chamber used to form the bottom oxynitride layer and decreasing the flow rate of the $N_2O/NH_3$ gas mixture relative to the $DCS/NH_3$ gas mixture to provide the desired ratio of the gas mixtures to yield the silicon-rich, nitrogen-rich, and oxygen-lean top nitride layer 818, 1518.

A suitable thickness for the bottom oxynitride layer 819, 1519 may be from about 30 Å to about 80 Å (with some variance permitted, for example ±10 A), of which about 5-20 Å may be consumed by radical oxidation to form the middle oxide layer. A suitable thickness for the top nitride layer 818, 1518 may be at least 30 Å. In certain embodiments, the upper nitride layer may be formed up to 130 Å thick, of which 30-70 Å may be consumed by radical oxidation to form the top oxide layer. A ratio of thicknesses between the bottom oxynitride layer and the top nitride layer is approximately 1:1 in some embodiments, although other ratios are also possible.

The top oxide layer 120 includes a relatively thick layer of $SiO_2$ of from about 30 Å to about 70 Å, and more preferably about 40-50 Å. The top oxide layer 120 may be formed or deposited by any suitable means including, for example, being thermally grown or deposited using CVD. In one embodiment, the top oxide layer 120 is a high-temperature-oxide (HTO) deposited using CVD process. This deposition process involves exposing the substrate 108 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

The top oxide layer 120 may be formed by oxidizing the top nitride layer 818, 1518. This may be accomplished in the same chamber used to form the nitride layers 116, 818, 819. The nitride layers 818, 819, 1518, 1519 may be formed in a first chamber, and the oxide layers 116, 1521, 120 may formed in a second chamber, of a two-chamber tool. Suitable tools include, for example, an ONO AVP, commercially available from AVIZA technology of Scotts Valley, Calif.

Although shown and described above as having two nitride layers, i.e., a top and a bottom layer, the present invention is not so limited, and the multi-layer charge storing structure may include a number, n, of nitride layers, any or all of which may have differing stoichiometric compositions of oxygen, nitrogen and/or silicon. In particular, multi-layer charge storing structures having up to five, and possibly more, nitride layers each with differing stoichiometric compositions are contemplated. At least some of these layers will be separated from the others by one or more relatively thin oxide layers. However, as will be appreciated by those skilled in the art it is generally desirable to utilize as few layers as possible to accomplish a desired result, reducing the process steps necessary to produce the device, and thereby providing a simpler and more robust manufacturing process. Moreover, utilizing as few layers as possible also results in higher yields as it is simpler to control the stoichiometric composition and dimensions of the fewer layers.

It will further be appreciated that although applicable as part of a SONOS stack in a SONOS memory device, the structure and method of the present invention is not so limited, and the ONO structure can be used in or with any semiconductor technology or in any device requiring a charge storing or dielectric layer or stack including, for example, in a split gate flash memory, a TaNOS stack, in a 1 T (transistor) SONOS cell, a 2T SONOS cell, a 3T SONOS cell, a localized 2-bit cell, and in a multilevel programming or cell, without departing from the scope of the invention.

Advantages of ONO structures and methods of forming the same according to an embodiment of the present invention over previous or conventional approaches include: (i) the ability to enhance data retention in memory devices using the structure by dividing the nitride layer into a plurality of films or layers and tailoring the oxygen, nitrogen and silicon profile across each layer, with an intermediate oxide layer to reduce the probability of charge tunneling; (ii) the ability to enhance speed of a memory device without compromising data retention; (iii) the ability to meet or exceed data retention and speed specifications for memory devices using an ONO structure of an embodiment of the present invention at a temperature of at least about 125° C.; and (iv) provide heavy duty program erase cycles of 100,000 cycles or more.

Implementations and Alternatives

In another aspect the present disclosure is directed to multigate or multigate-surface memory devices including charge-trapping regions overlying two or more sides of a channel formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

Figure 16A:
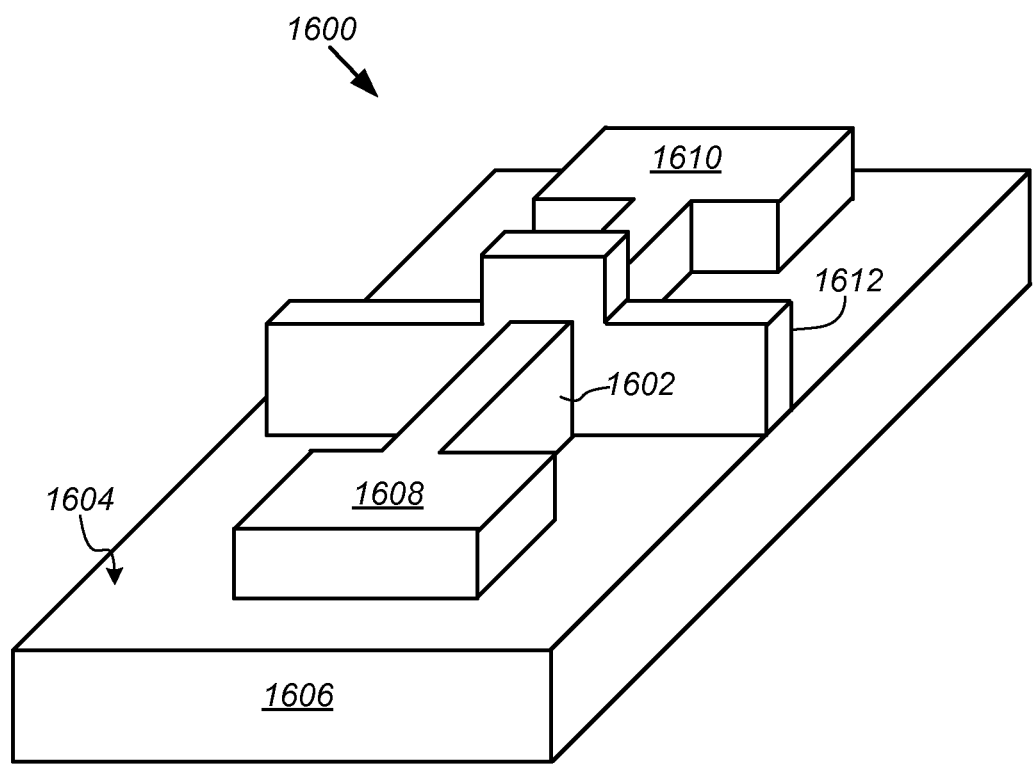
FIG. 16A illustrates a non-planar multigate device including a split charge-trapping region.

FIG. 16A illustrates one embodiment of a non-planar multigate memory device including a charge-trapping region. Referring to FIG. 16A, the memory device 1600, commonly referred to as a finFET, includes a channel 1602 formed from a thin film or layer of semiconducting material overlying a surface 1604 on a substrate 1606 connecting a source 1608 and a drain 1610 of the memory device. The channel 1602 is enclosed on three sides by a fin which forms a gate 1612 of the device. The thickness of the gate 1612 (measured in the direction from source to drain) determines the effective channel length of the device.

Figure 16B:
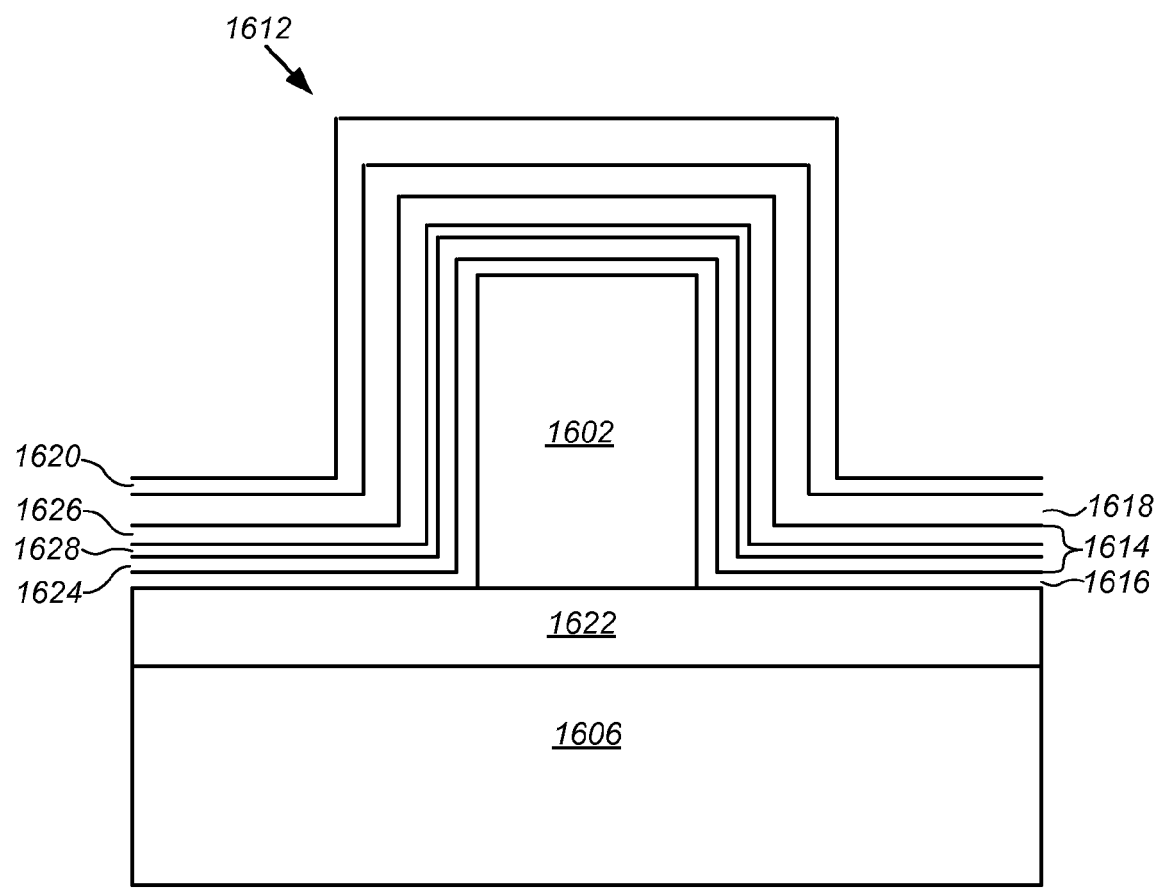
FIG. 16B illustrates a cross-sectional view of the non-planar multigate device of FIG. 16A.

In accordance with the present disclosure, the non-planar multigate memory device 1600 of FIG. 16A can include a split charge-trapping region. FIG. 16B is a cross-sectional view of a portion of the non-planar memory device of FIG. 16A including a portion of the substrate 1606, channel 1602 and the gate 1612 illustrating a split charge-trapping region 1614. The gate 1612 further includes a tunnel oxide 1616 overlying a raised channel 1602, a blocking dielectric 1618 and a metal gate layer 1620 overlying the blocking layer to form a control gate of the memory device 1600. In some embodiments a doped polysilicon may be deposited instead of metal to provide a polysilicon gate layer. The channel 1602 and gate 1612 can be formed directly on substrate 1606 or on an insulating or dielectric layer 1622, such as a buried oxide layer, formed on or over the substrate.

Referring to FIG. 16B, the split charge-trapping region 1614 includes at least one lower or bottom charge-trapping layer 1624 comprising nitride closer to the tunnel oxide 1616, and an upper or top charge-trapping layer 1626 overlying the bottom charge-trapping layer. Generally, the top charge-trapping layer 1626 comprises a silicon-rich, oxygen-lean nitride layer and comprises a majority of a charge traps distributed in multiple charge-trapping layers, while the bottom charge-trapping layer 1624 comprises an oxygen-rich nitride or silicon oxynitride, and is oxygen-rich relative to the top charge-trapping layer to reduce the number of charge traps therein. By oxygen-rich it is meant wherein a concentration of oxygen in the bottom charge-trapping layer 1624 is from about 15 to about 40%, whereas a concentration of oxygen in top charge-trapping layer 1626 is less than about 5%.

In one embodiment, the blocking dielectric 1618 also comprises an oxide, such as an HTO, to provide an ONNO structure. The channel 1602 and the overlying ONNO structure can be formed directly on a silicon substrate 1606 and overlaid with a doped polysilicon gate layer 1620 to provide a SONNOS structure.

In some embodiments, such as that shown in FIG. 16B, the split charge-trapping region 1614 further includes at least one thin, intermediate or anti-tunneling layer 1628 comprising a dielectric, such as an oxide, separating the top charge-trapping layer 1626 from the bottom charge-trapping layer 1624. The anti-tunneling layer 1628 substantially reduces the probability of electron charge that accumulates at the boundaries of the upper nitride layer 1626 during programming from tunneling into the bottom nitride layer 1624, resulting in lower leakage current than for the structures illustrated in FIG. 1 and FIG. 6.

As with the embodiments described above, either or both of the bottom charge-trapping layer 1624 and the top charge-trapping layer 1626 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The top charge-trapping layer 1626 has a stoichiometric composition of oxygen, nitrogen and/or silicon different from that of the bottom charge-trapping layer 1624, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1628 comprising oxide, the anti-tunneling layer can be formed by oxidation of the bottom oxynitride layer, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments including a blocking dielectric 1618 comprising oxide the oxide may be formed or deposited by any suitable means. In one embodiment the oxide of the blocking dielectric 1618 is a high temperature oxide deposited in a HTO CVD process. Alternatively, the blocking dielectric 1618 or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

A suitable thickness for the bottom charge-trapping layer 1624 may be from about 30 Å to about 80 Å (with some variance permitted, for example ±10 A), of which about 5-20 Å may be consumed by radical oxidation to form the anti-tunneling layer 1628. A suitable thickness for the top charge-trapping layer 1626 may be at least 30 Å. In certain embodiments, the top charge-trapping layer 1626 may be formed up to 130 Å thick, of which 30-70 Å may be consumed by radical oxidation to form the blocking dielectric 1618. A ratio of thicknesses between the bottom charge-trapping layer 1624 and top charge-trapping layer 1626 is approximately 1:1 in some embodiments, although other ratios are also possible.

In other embodiments, either or both of the top charge-trapping layer 1626 and the blocking dielectric 1618 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

Figure 17A:
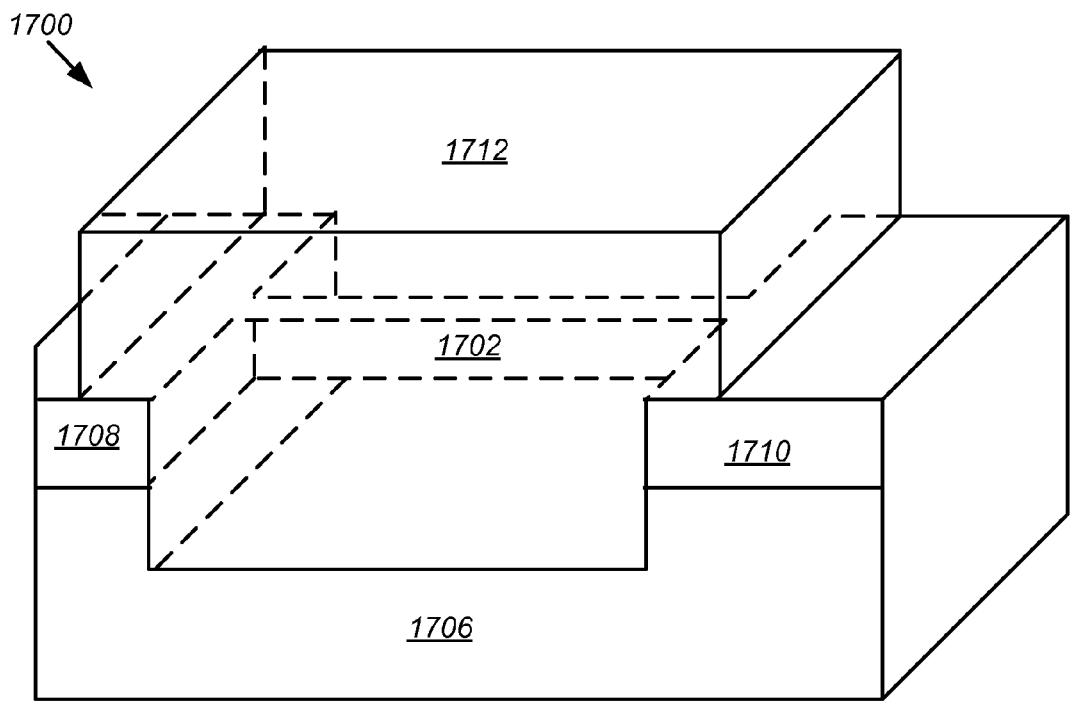
FIGS. 17A and 17B illustrate a non-planar multigate device including a split charge-trapping region and a horizontal nanowire channel.
Figure 17B:
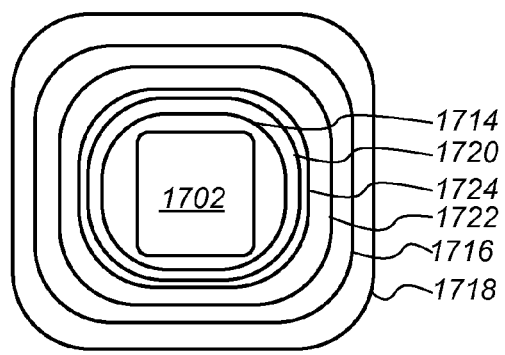

In another embodiment, shown in FIGS. 17A and 17B, the memory device can include a nanowire channel formed from a thin film of semiconducting material overlying a surface on a substrate connecting a source and a drain of the memory device. By nanowire channel it is meant a conducting channel formed in a thin strip of crystalline silicon material, having a maximum cross-sectional dimension of about 10 nanometers (nm) or less, and more preferably less than about 6 nm. Optionally, the channel can be formed to have <100> surface crystalline orientation relative to a long axis of the channel.

Referring to FIG. 17A, the memory device 1700 includes a horizontal nanowire channel 1702 formed from a thin film or layer of semiconducting material on or overlying a surface on a substrate 1706, and connecting a source 1708 and a drain 1710 of the memory device. In the embodiment shown, the device has a gate-all-around (GAA) structure in which the nanowire channel 1702 is enclosed on all sides by a gate 1712 of the device. The thickness of the gate 1712 (measured in the direction from source to drain) determines the effective channel length of the device.

In accordance with the present disclosure, the non-planar multigate memory device 1700 of FIG. 17A can include a split charge-trapping region. FIG. 17B is a cross-sectional view of a portion of the non-planar memory device of FIG. 17A including a portion of the substrate 1706, nanowire channel 1702 and the gate 1712 illustrating a split charge-trapping region. Referring to FIG. 17B, the gate 1712 includes a tunnel oxide 1714 overlying the nanowire channel 1702, a split charge-trapping region, a blocking dielectric 1716 and a gate layer 1718 overlying the blocking layer to form a control gate of the memory device 1700. The gate layer 1718 can comprise a metal or a doped polysilicon. The split charge-trapping region includes at least one inner charge-trapping layer 1720 comprising nitride closer to the tunnel oxide 1714, and an outer charge-trapping layer 1722 overlying the inner charge-trapping layer. Generally, the outer charge-trapping layer 1722 comprises a silicon-rich, oxygen-lean nitride layer and comprises a majority of a charge traps distributed in multiple charge-trapping layers, while the inner charge-trapping layer 1720 comprises an oxygen-rich nitride or silicon oxynitride, and is oxygen-rich relative to the outer charge-trapping layer to reduce the number of charge traps therein.

In some embodiments, such as that shown, the split charge-trapping region further includes at least one thin, intermediate or anti-tunneling layer 1724 comprising a dielectric, such as an oxide, separating outer charge-trapping layer 1722 from the inner charge-trapping layer 1720. The anti-tunneling layer 1724 substantially reduces the probability of electron charge that accumulates at the boundaries of outer charge-trapping layer 1722 during programming from tunneling into the inner charge-trapping layer 1720, resulting in lower leakage current.

As with the embodiment described above, either or both of the inner charge-trapping layer 1720 and the outer charge-trapping layer 1722 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multilayer charge storing structure is then formed on the middle oxide layer. The outer charge-trapping layer 1722 has a stoichiometric composition of oxygen, nitrogen and/or silicon different from that of the inner charge-trapping layer 1720, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1724 comprising oxide, the anti-tunneling layer can be formed by oxidation of the inner charge-trapping layer 1720, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments in which the blocking dielectric 1716 comprises oxide, the oxide may be formed or deposited by any suitable means. In one embodiment the oxide of blocking dielectric 1716 is a high temperature oxide deposited in a HTO CVD process. Alternatively, the blocking dielectric 1716 or blocking oxide layer may be thermally grown, however it will be appreciated that in this embodiment the thickness of the outer charge-trapping layer 1722 may need to be adjusted or increased as some of the top nitride will be effectively consumed or oxidized during the process of thermally growing the blocking oxide layer.

A suitable thickness for the inner charge-trapping layer 1720 may be from about 30 Å to about 80 Å (with some variance permitted, for example ±10 Å), of which about 5-20 Å may be consumed by radical oxidation to form the anti-tunneling layer 1724. A suitable thickness for the outer charge-trapping layer 1722 may be at least 30 Å. In certain embodiments, the outer charge-trapping layer 1722 may be formed up to 130 Å thick, of which 30-70 Å may be consumed by radical oxidation to form the blocking dielectric 1716. A ratio of thicknesses between the inner charge-trapping layer 1720 and the outer charge-trapping layer 1722 is approximately 1:1 in some embodiments, although other ratios are also possible.

In other embodiments, either or both of the outer charge-trapping layer 1722 and the blocking dielectric 1716 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

In another embodiment, the memory device is or includes a non-planar device comprising a vertical nanowire channel formed in or from a semiconducting material projecting above or from a number of conducting, semiconducting layers on a substrate. In one version of this embodiment, shown in cut-away in FIG. 18A, the memory device 1800 comprises a vertical nanowire channel 1802 formed in a cylinder of semiconducting material connecting a source 1804 and drain 1806 of the device. The channel 1802 is surrounded by a tunnel oxide 1808, a charge-trapping region 1810, a blocking layer 1812 and a gate layer 1814 overlying the blocking layer to form a control gate of the memory device 1800. The channel 1802 can include an annular region in an outer layer of a substantially solid cylinder of semiconducting material, or can include an annular layer formed over a cylinder of dielectric filler material. As with the horizontal nanowires described above, the channel 1802 can comprise polysilicon or recrystallized polysilicon to form a monocrystalline channel. Optionally, where the channel 1802 includes a crystalline silicon, the channel can be formed to have <100> surface crystalline orientation relative to a long axis of the channel.

Figure 18A:
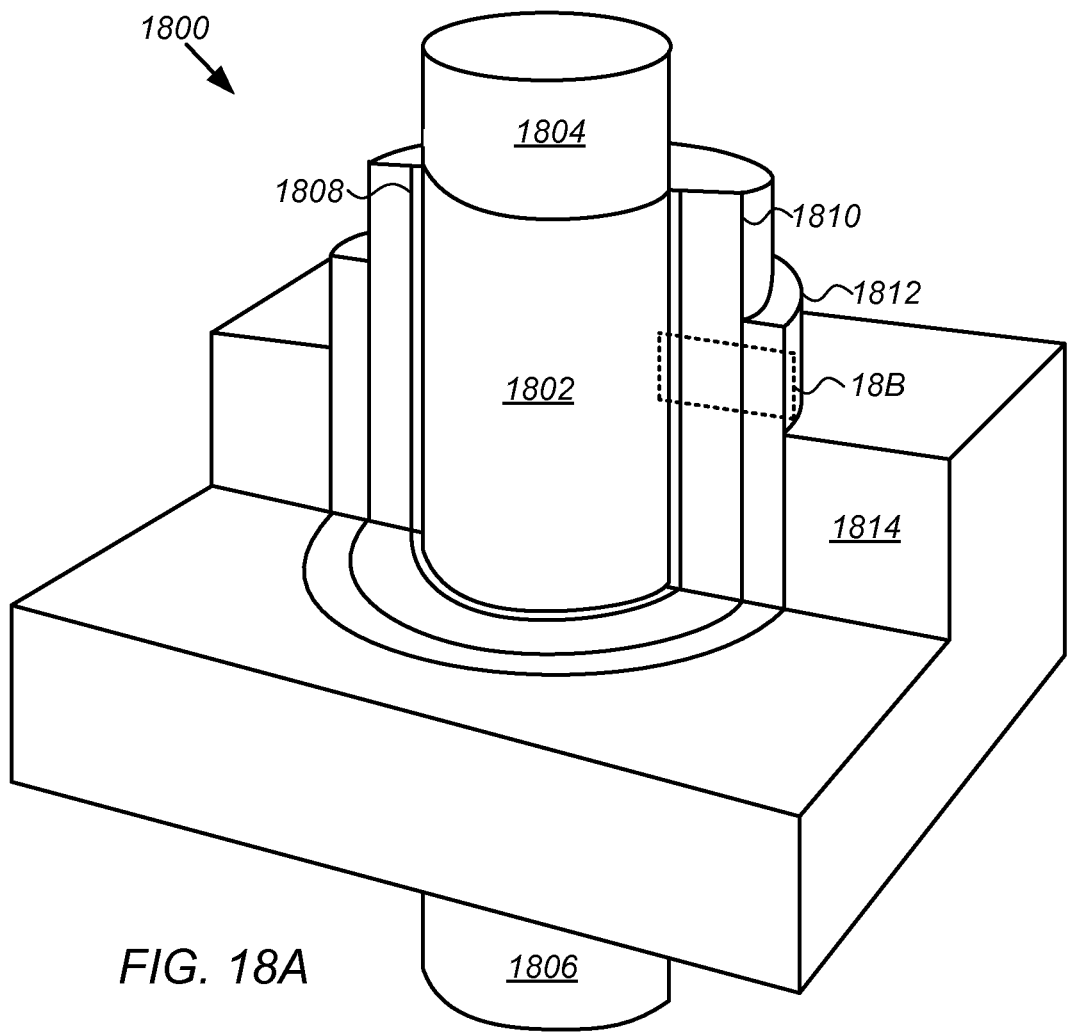
FIGS. 18A and 18B illustrate a non-planar multigate device including a split charge-trapping region and a vertical nanowire channel.
Figure 18B:
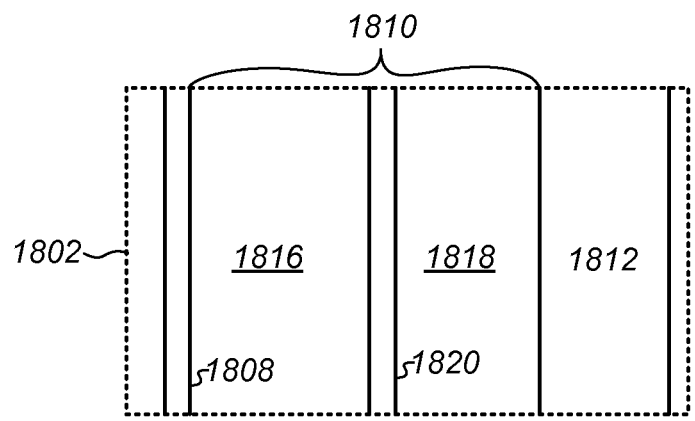

In some embodiments, such as that shown in FIG. 18B, the charge-trapping region 1810 can be a split charge-trapping region including at least a first or inner charge trapping layer 1816 closest to the tunnel oxide 1808, and a second or outer charge trapping layer 1818. Optionally, the first and second charge trapping layers can be separated by an intermediate oxide or anti-tunneling layer 1820.

As with the embodiments described above, either or both of the first charge trapping layer 1816 and the second charge trapping layer 1818 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer.

Finally, either or both of the second charge trapping layer 1818 and the blocking layer 1812 may comprise a high K dielectric, such as HfSiON, HfSiO, HfO, ZrSiON, ZrSiO, ZrO, or $Y_2O_3$.

A suitable thickness for the first charge trapping layer 1816 may be from about 30 Å to about 80 Å (with some variance permitted, for example ±10 Å), of which about 5-20 Å may be consumed by radical oxidation to form the anti-tunneling layer 1820. A suitable thickness for the second charge trapping layer 1818 may be at least 30 Å, and a suitable thickness for the blocking dielectric 1812 may be from about 30-70 Å.

The memory device 1800 of FIG. 18A can be made using either a gate first or a gate last scheme. FIG. 19A-F illustrate a gate first scheme for fabricating the non-planar multigate device of FIG. 18A. FIG. 20A-F illustrate a gate last scheme for fabricating the non-planar multigate device of FIG. 18A.

Figure 19A:
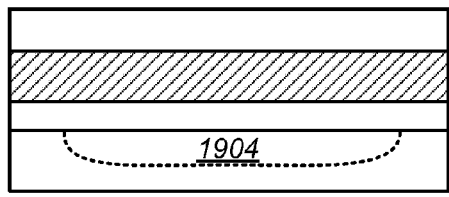
FIGS. 19A to 19F illustrate a gate first scheme for fabricating the non-planar multigate device of FIG. 18A.

Referring to FIG. 19A, in a gate first scheme a first or lower dielectric layer 1902, such as a blocking oxide, is formed over a first, doped diffusion region 1904, such as a source or a drain, in a substrate 1906. A gate layer 1908 is deposited over the first dielectric layer 1902 to form a control gate of the device, and a second or upper dielectric layer 1910 formed thereover. As with embodiments described above, the first and second dielectric layers 1902, 1910, can be deposited by CVD, radical oxidation or be formed by oxidation of a portion of the underlying layer or substrate. The gate layer 1908 can comprise a metal deposited or a doped polysilicon deposited by CVD. Generally the thickness of the gate layer 1908 is from about 40-50 Å, and the first and second dielectric layers 1902, 1910, from about 20-80 Å.

Figure 19B:
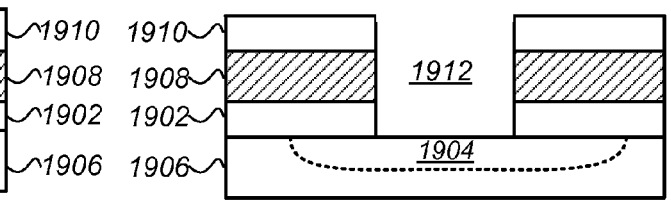
Figure 19C:
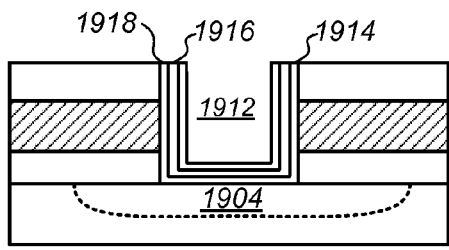

Referring to FIG. 19B, a first opening 1912 is etched through the overlying gate layer 1908, and the first and second dielectric layers 1902, 1910, to the diffusion region 1904 in the substrate 1906. Next, layers of a tunneling oxide 1914, charge-trapping region 1916, and blocking dielectric 1918 are sequentially deposited in the opening and the surface of the upper dielectric layer 1910 planarize to yield the intermediate structure shown in FIG. 19C.

Although not shown, it will be understood that as in the embodiments described above the charge-trapping region 1916 can include a split charge-trapping region comprising at least one lower or bottom charge-trapping layer closer to the tunnel oxide 1914, and an upper or top charge-trapping layer overlying the bottom charge-trapping layer. Generally, the top charge-trapping layer comprises a silicon-rich, oxygen-lean nitride layer and comprises a majority of a charge traps distributed in multiple charge-trapping layers, while the bottom charge-trapping layer comprises an oxygen-rich nitride or silicon oxynitride, and is oxygen-rich relative to the top charge-trapping layer to reduce the number of charge traps therein. In some embodiments, the split charge-trapping region 1916 further includes at least one thin, intermediate or anti-tunneling layer comprising a dielectric, such as an oxide, separating the top charge-trapping layer from the bottom charge-trapping layer.

Figure 19D:
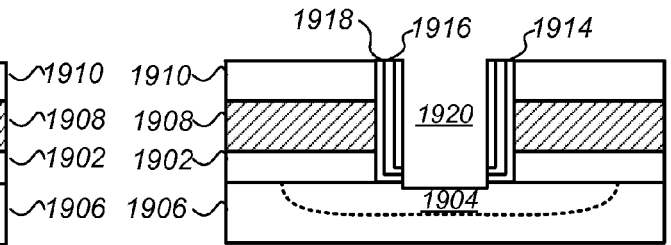
Figure 19E:
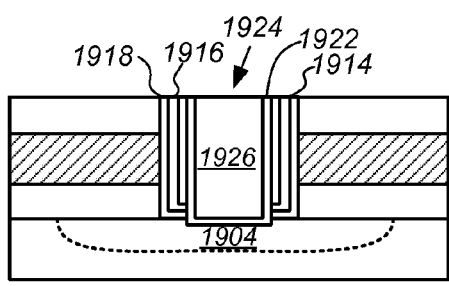

Next, a second or channel opening 1920 is anisotropically etched through tunneling oxide 1914, charge-trapping region 1916, and blocking dielectric 1918, FIG. 19D. Referring to FIG. 19E, a semiconducting material 1922 is deposited in the channel opening to form a vertical channel 1924 therein. The vertical channel 1924 can include an annular region in an outer layer of a substantially solid cylinder of semiconducting material, or, as shown in FIG. 19E, can include a separate, layer semiconducting material 1922 surrounding a cylinder of dielectric filler material 1926.

Figure 19F:
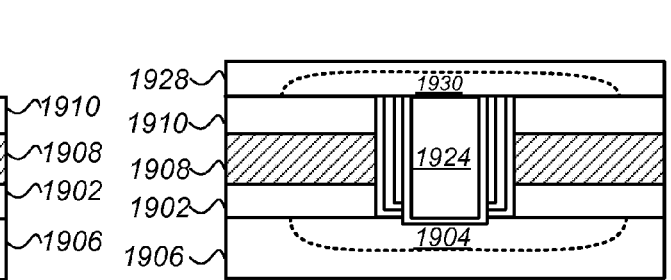

Referring to FIG. 19F, the surface of the upper dielectric layer 1910 is planarized and a layer of semiconducting material 1928 including a second, doped diffusion region 1930, such as a source or a drain, formed therein deposited over the upper dielectric layer to form the device shown.

Referring to FIG. 20, in a gate last scheme a dielectric layer 2002, such as an oxide, is formed over a sacrificial layer 2004 on a surface on a substrate 2006, an opening etched through the dielectric and sacrificial layers and a vertical channel 2008 formed therein. As with embodiments described above, the vertical channel 2008 can include an annular region in an outer layer of a substantially solid cylinder of semiconducting material 2010, such as a polycrystalline or monocrystalline silicon, or can include a separate, layer semiconducting material surrounding a cylinder of dielectric filler material (not shown). The dielectric layer 2002 can comprise any suitable dielectric material, such as a silicon oxide, capable of electrically isolating the subsequently formed gate layer of the memory device 1800 from an overlying electrically active layer or another memory device. The sacrificial layer 2004 can comprise any suitable material that can be etched or removed with high selectivity relative to the material of the dielectric layer 2002, substrate 2006 and vertical channel 2008.

Figure 20A:
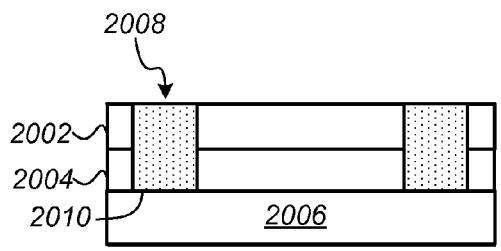
FIGS. 20A to 20F illustrate a gate last scheme for fabricating the non-planar multigate device of FIG. 18A.
Figure 20B:
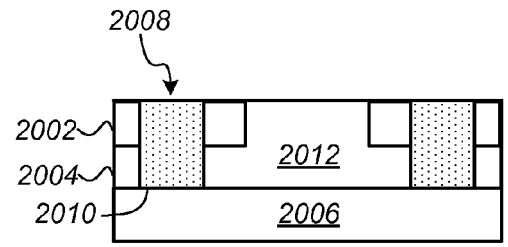

Referring to FIG. 20B, a second opening 2012 is etched through the etched through the dielectric and sacrificial layers 2002, 2004, to the substrate 1906, and the sacrificial layer 2004 etched or removed. The sacrificial layer 2004 can comprise any suitable material that can be etched or removed with high selectivity relative to the material of the dielectric layer 2002, substrate 2006 and vertical channel 2008. In one embodiment the sacrificial layer 2004 comprises silicon dioxide that can be removed by buffered oxide etch (BOE etch).

Figure 20C:
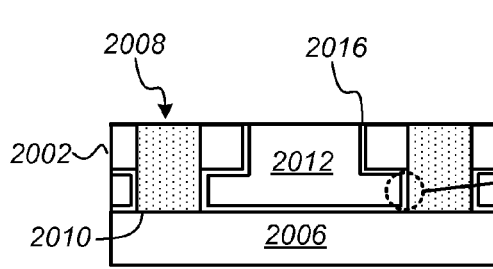
Figure 20D:
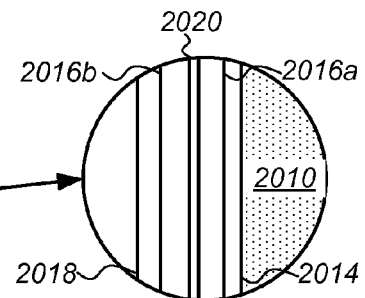

Referring to FIGS. 20C and 20D, layers of a tunneling oxide 2014, charge-trapping region 2016, and blocking dielectric 2018 are sequentially deposited in the opening and the surface of the dielectric layer 2002 planarize to yield the intermediate structure shown in FIGS. 20C and 20D. In some embodiments, such as that shown in FIG. 20D, the charge-trapping region 2016 can be a split charge-trapping region including at least a first or inner charge trapping layer 2016*a* closest to the tunnel oxide 2014, and a second or outer charge trapping layer 2016*b*. Optionally, the first and second charge trapping layers can be separated by an intermediate oxide or anti-tunneling layer 2020.

Figure 20E:
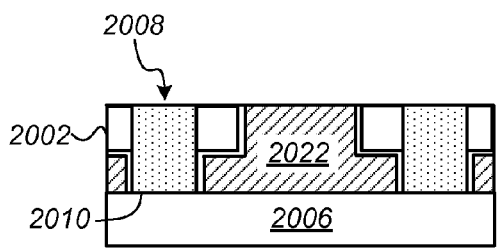
Figure 20F:
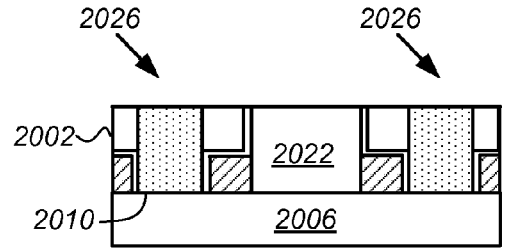

Next, a gate layer 2022 is deposited into the second opening 2012 and the surface of the upper dielectric layer 2002 planarized to yield the intermediate structure illustrated in FIG. 20E. As with embodiments described above, the gate layer 2022 can comprise a metal deposited or a doped polysilicon. Finally, an opening 2024 is etched through the gate layer 2022 to form control gate of separate memory devices 2026.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Embodiments of the charge retention devices described herein may be employed in logic circuits to function as machine-memory. Those having skill in the art will appreciate that there are various logic implementations that may embody the described structures, and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are many vehicles that may employ the devices described herein, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof.

Embodiments of the structures described herein may be employed in Application Specific Integrated Circuits (ASICs), Field Programmable Gate Arrays (FPGAs), central processing units (CPUs), digital signal processors (DSPs), or other integrated formats. However, those skilled in the art will recognize that some aspects of the embodiments disclosed herein, in whole or in part, can be equivalently implemented in dedicated memory circuits, for the purpose of storing digital information for data and/or programs running on one or more computers (e.g., as one or more programs running on one or more computer systems), as one or more programs running on one or more processors (e.g., as one or more programs running on one or more microprocessors), as firmware, or as virtually any combination thereof.

In a general sense, those skilled in the art will recognize that the various structures described herein may be embodied, individually and/or collectively, by a wide range of electrical circuitry. As used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system without an undue amount of experimentation.

What is claimed is:

1. A memory device comprising:
   a channel formed from a thin film of semiconducting material overlying a surface on a substrate connecting a source and a drain of the memory device;
   a tunnel oxide overlying the channel;
   a split charge-trapping region overlying the tunnel oxide, the split charge-trapping region including a bottom charge-trapping layer comprising a nitride closer to the tunnel oxide, and a top charge-trapping layer, wherein the bottom charge-trapping layer is separated from the top charge-trapping layer by a thin anti-tunneling layer comprising an oxide,
   wherein the top charge-trapping layer comprises a silicon-rich, oxygen-lean nitride, the bottom charge-trapping layer comprises an oxygen-rich nitride, and further comprising a blocking dielectric layer overlying the split charge-trapping region.

2. The memory device of claim 1, wherein the top charge-trapping layer comprises a majority of a charge traps distributed in split charge-trapping region.

3. The memory device of claim 1, wherein the blocking layer comprises a high K dielectric.

4. The memory device of claim 1, wherein the channel is fabricated from silicon having <100> surface crystalline orientation relative to a long axis of the channel.

5. The memory device of claim 1, wherein the channel comprises polysilicon.

6. The memory device of claim 1, wherein the channel comprises recrystallized polysilicon.

7. The memory device of claim 1, wherein the channel comprises a silicon nanowire.

8. The memory device of claim 1, wherein the tunnel oxide comprises a nitrided oxide.

9. A memory device comprising:
   a channel formed from a thin film of semiconducting material overlying a surface on a substrate connecting a source and a drain of the memory device;
   a tunnel oxide overlying the channel;
   a split charge-trapping region overlying the tunnel oxide, the split charge-trapping region including a bottom charge-trapping layer comprising a nitride closer to the tunnel oxide, and a top charge-trapping layer, wherein the bottom charge-trapping layer is separated from the top charge-trapping layer by a thin anti-tunneling layer comprising an oxide,
   wherein the channel projects above the surface on the substrate, and further comprising a fin intersecting and overlying at least a portion of the channel, the fin comprising the tunnel oxide and the split charge-trapping region overlying the tunnel oxide, and
   wherein the top charge-trapping layer comprises a silicon-rich, oxygen-lean nitride, the bottom charge-trapping layer comprises an oxygen-rich nitride layer, and further comprising a blocking oxide layer overlying the split charge-trapping region.

10. The memory device of claim 9, further comprising a metal gate layer overlying the blocking oxide layer.

11. The memory device of claim 9, wherein the blocking layer comprises a high K dielectric.

12. The memory device of claim 9, wherein the channel is fabricated from silicon having <100> surface crystalline orientation relative to a long axis of the channel.

13. The memory device of claim 9, wherein the channel comprises polysilicon.

14. A memory device comprising:
   a vertical channel formed from a thin projection of semiconducting material extending from a first diffusion region formed on a surface on a substrate to a second diffusion region formed over the surface of the substrate, the vertical channel electrically connecting the first diffusion region to the second diffusion region;
   a tunnel oxide abutting the vertical channel;
   a split charge-trapping region abutting the tunnel oxide, the split charge-trapping region including a first charge-trapping layer comprising an oxygen-rich nitride closer to the tunnel oxide, and a second charge-trapping layer comprising a silicon-rich, oxygen-lean nitride overlying the first charge-trapping layer,
   wherein the second charge-trapping layer comprises a majority of a charge traps distributed in split charge-trapping region.

15. The non-planar memory device of claim 14, wherein the first charge-trapping layer is separated from the second charge-trapping layer by a thin anti-tunneling layer comprising an oxide.

16. The non-planar memory device of claim 15, wherein the vertical channel comprises silicon.

17. The non-planar memory device of claim 15, further comprising a high K dielectric blocking layer abutting the split charge-trapping region.

18. The non-planar memory device of claim 14, further comprising a high K dielectric blocking layer abutting the split charge-trapping region.

19. A process of manufacturing a semiconductor device, the process comprising:
- forming a channel from a thin film of semiconducting material overlying a surface on a substrate connecting a source and a drain of the memory device;
- forming a tunnel oxide overlying the channel;
- forming a split charge-trapping region over the tunnel oxide including a bottom charge-trapping layer comprising an oxygen-rich nitride overlying the tunnel oxide, a thin anti-tunneling layer comprising an oxide overlying the tunnel oxide bottom charge-trapping layer, and a top charge-trapping layer comprising a silicon-rich, oxygen-lean nitride overlying the thin anti-tunneling layer,
- wherein the top charge-trapping layer comprises a majority of a charge traps distributed in split charge-trapping region.

20. The process of claim 19, wherein forming the channel comprises forming from the thin film of semiconducting material overlying the surface on the substrate a channel connecting a source and a drain raised above the surface on the substrate.

* * * * *

UNITED STATES PATENT AND TRADEMARK OFFICE
CERTIFICATE OF CORRECTION

PATENT NO. : 8,710,578 B2  
APPLICATION NO. : 13/431069  
DATED : April 29, 2014  
INVENTOR(S) : Fredrick Jenne and Krishnaswamy Ramkumar Page 1 of 1

It is certified that error appears in the above-identified patent and that said Letters Patent is hereby corrected as shown below:

In the Specification

In Column 1, Line 33, delete "structure 100" and insert --structure 102--.

In Column 2, Line 35, delete "in FIG. 14" and insert --in FIG. 11--.

In Column 6, Line 26, after "placed" delete "in a".

In Column 13, Line 49, delete "FIG. 20" and insert --FIG. 20A--.

In Column 14, Line 2, after "through" delete "the etched through".

In Column 14, Line 3, delete "1906" and insert --2006--.

Signed and Sealed this  
Eleventh Day of November, 2014

Michelle K. Lee  
*Deputy Director of the United States Patent and Trademark Office*